US009417818B2

(12) United States Patent
Takeuchi

(10) Patent No.: US 9,417,818 B2
(45) Date of Patent: Aug. 16, 2016

(54) SEMICONDUCTOR MEMORY FOR CAPACITIVELY BIASING MULTIPLE SOURCE LINES

(71) Applicant: SOCIONEXT INC., Yokohama-shi, Kanagawa (JP)

(72) Inventor: Atsushi Takeuchi, Akiruno (JP)

(73) Assignee: SOCIONEXT INC., Yokohama (JP)

( * ) Notice: Subject to any disclaimer, the term of this patent is extended or adjusted under 35 U.S.C. 154(b) by 224 days.

(21) Appl. No.: 14/031,911

(22) Filed: Sep. 19, 2013

(65) Prior Publication Data

US 2014/0089570 A1 Mar. 27, 2014

(30) Foreign Application Priority Data

Sep. 25, 2012 (JP) ................................. 2012-210399

(51) Int. Cl.
*G11C 16/10* (2006.01)
*G11C 16/06* (2006.01)
*G06F 3/06* (2006.01)
*G11C 16/08* (2006.01)
*G11C 16/24* (2006.01)
*G11C 16/34* (2006.01)

(52) U.S. Cl.
CPC .............. *G06F 3/0679* (2013.01); *G06F 3/061* (2013.01); *G06F 3/064* (2013.01); *G11C 16/06* (2013.01); *G11C 16/08* (2013.01); *G11C 16/10* (2013.01); *G11C 16/24* (2013.01); *G11C 16/3427* (2013.01)

(58) Field of Classification Search
CPC .............. G11C 16/10; G11C 16/0483; G11C 16/3427; G11C 16/3418
USPC ........................................ 365/185.18, 185.02
See application file for complete search history.

(56) References Cited

U.S. PATENT DOCUMENTS

| 5,657,268 | A | 8/1997 | Truong et al. |
| 5,844,843 | A | 12/1998 | Matsubara et al. |
| 8,406,052 | B2 * | 3/2013 | Lee ..................... G11C 11/5628 365/185.03 |
| 8,976,590 | B2 * | 3/2015 | Takeuchi ............... G11C 16/10 365/185.03 |

(Continued)

FOREIGN PATENT DOCUMENTS

| JP | 05-266220 A | 10/1993 |
| JP | 06-314495 A | 11/1994 |

(Continued)

OTHER PUBLICATIONS

Chung, S. S. et al. N-Channel Versus P-Channel Flash EEPROM—Which one has better reliabilities, 2001, IEEE, 39th Annual International Reliability Physics Symposium, p. 67-72.*

(Continued)

*Primary Examiner* — Douglas King
*Assistant Examiner* — Jerome Leboeuf
(74) *Attorney, Agent, or Firm* — Arent Fox LLP

(57) ABSTRACT

A memory block area in a semiconductor memory includes program segments. Each program segment includes a group of memory cells arranged at positions where word lines and bit lines intersect and connected to a common source line. The word lines are shared by the program segments. At program operation time source line switches are used for supplying first voltage to a source line in a program segment, of the program segments, including a memory cell to be programmed and supplying second voltage to a source line in a program segment, of the program segments, not including the memory cell to be programmed.

8 Claims, 29 Drawing Sheets

(56) References Cited

U.S. PATENT DOCUMENTS

| | | |
|---|---|---|
| 2003/0072176 A1 | 4/2003 | Watanabe |
| 2007/0127294 A1* | 6/2007 | Umezawa .......... G11C 16/0416 365/185.18 |
| 2008/0273387 A1 | 11/2008 | Ajika et al. |
| 2009/0224809 A1 | 9/2009 | Matsumoto et al. |
| 2011/0134694 A1* | 6/2011 | Lee .................... G11C 11/5628 365/185.03 |
| 2011/0188310 A1* | 8/2011 | Kim ....................... G11C 16/06 365/185.11 |
| 2012/0320678 A1* | 12/2012 | Maejima ............ G11C 16/0483 365/185.11 |
| 2014/0085981 A1* | 3/2014 | Takeuchi ............... G11C 16/10 365/185.12 |

FOREIGN PATENT DOCUMENTS

| | | |
|---|---|---|
| JP | 09-180478 A | 7/1997 |
| JP | 2001-291392 A | 10/2001 |
| JP | 2003-123493 A | 4/2003 |
| JP | 2004-039091 A | 2/2004 |
| JP | 2006-156925 A | 6/2006 |
| JP | 2008-192254 A | 8/2008 |
| JP | 2009-212992 A | 9/2009 |

OTHER PUBLICATIONS

Notice of Allowance issued Nov. 7, 2014; U.S. Appl. No. 13/971,496.
Office Action dated Jul. 15, 2014; U.S. Appl. No. 13/971,496.
Office Action of Japanese Patent Application No. 2012-210399 dated May 10, 2016 with partial translation.

* cited by examiner

FIG. 12

| | | READ | ERASE | PROGRAM |
|---|---|---|---|---|
| WL0-3 | SELECTED | -3V | -9V | 9V |
| | NON-SELECTED | 1.8V | ... | 0V |
| BL0-3 | SELECTED | 0~1.8V | HiZ | 0V |
| | NON-SELECTED | HiZ | HiZ | 2.4V |
| SRC0 | | 1.8V | 9V | 1.8V |
| NW0 | | 1.8V | 9V | 5V |

FIG. 27

|  | PSEG0 | PSEG1 | PSEG2 | PSEG3 |
|---|---|---|---|---|
| NUMBER OF BLS | 256 | 256 | 256 | 256 |
| NUMBER OF SELECTED BLS | 8 | 8 | 0 | 0 |
| DI | Lower | Upper | 0 | 0 |

SEMICONDUCTOR MEMORY FOR CAPACITIVELY BIASING MULTIPLE SOURCE LINES

CROSS-REFERENCE TO RELATED APPLICATION

This application is based upon and claims the benefit of priority of the prior Japanese Patent Application No. 2012-210399, filed on Sep. 25, 2012, the entire contents of which are incorporated herein by reference.

FIELD

The embodiments discussed herein are related to a semiconductor memory.

BACKGROUND

Memories such as flash memories, EPROMs (Erasable Programmable Read Only Memories), EEPROMs (Electrically Erasable Programmable Read Only Memories) are known as semiconductor memories. A form of semiconductor memory in which data is written (programmed) by injecting channel hot electrons into a charge storage layer of a memory cell is known. In addition, a form of semiconductor memory in which data is programmed by injecting hot electrons generated near a drain by an interband tunneling phenomenon is known.

A form of semiconductor memory in which a memory cell array is divided into a plurality of blocks each including a plurality of memory cells is known. In addition, a form of semiconductor memory in which a group of memory cells arranged in one direction in a block is connected to a common word line, in which a group of memory cells arranged in another direction in the block is connected to a common bit line, and in which all memory cells in the block are connected to a common source line is known. Furthermore, the technique of controlling voltage of a source line in each block or voltage of source lines in different blocks at program operation time is known.

Japanese Laid-open Patent Publication No. 2006-156925
Japanese Laid-open Patent Publication No. 2009-212992
Japanese Laid-open Patent Publication No. 2004-39091
Japanese Laid-open Patent Publication No. 2001-291392
Japanese Laid-open Patent Publication No. 2003-123493

With the above semiconductor memories including blocks, a program non-target memory cell connected to the same word line where a program target memory cell in a block is connected is influenced by gate disturb at program operation time. If control is exercised to increase voltage of a source line in the block, then the resistance to gate disturb of the program non-target memory cell connected to the same word line where the program target memory cell is connected is improved. However, if voltage of the source line in the block is increased, then current which flows through a program non-target memory cell connected to the same bit line where the program target memory cell in the block is connected increases.

SUMMARY

According to an aspect, there is provided a semiconductor memory including a plurality of memory blocks which each include a group of memory cells arranged at positions where a group of word lines and a group of bit lines intersect and connected to a common source line, which share the group of word lines, and which each include source lines separated from one another and a circuit which supplies first voltage at program operation time to a source line in a memory block, of the plurality of memory blocks, including a memory cell to be programmed and which supplies second voltage different from the first voltage at the program operation time to a source line in a memory block, of the plurality of memory blocks, not including the memory cell to be programmed.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 12 indicates examples of setting voltage;
FIG. 27 indicates an example of selected bit line assignment.

DESCRIPTION OF EMBODIMENTS

A detailed description will now be given with reference to the accompanying drawings with a flash memory as an example.

Figure 1:
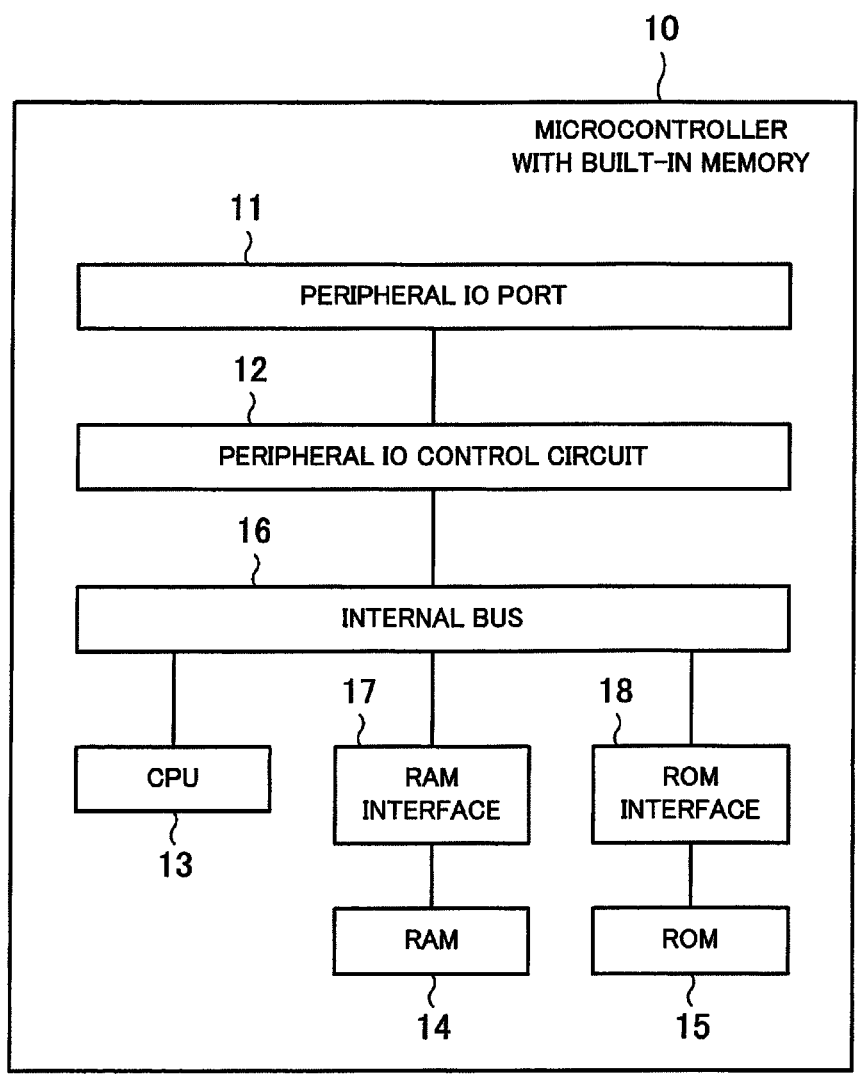
FIG. 1 indicates an example of the structure of a microcontroller with a built-in memory.

FIG. 1 indicates an example of the structure of a microcontroller with a built-in memory.

A microcontroller with a built-in memory 10 includes a peripheral IO (Input/Output) port 11, a peripheral IO control circuit 12, a CPU (Central Processing Unit) 13, a RAM (Random Access Memory) 14, and a ROM (Read only Memory) 15.

The microcontroller with the built-in memory 10 is controlled by the CPU 13. A RAM interface 17 is connected to the CPU 13 via an internal bus 16 and the RAM 14 is connected to the RAM interface 17. Furthermore, a ROM interface 18 is connected to the CPU 13 via the internal bus 16 and the ROM 15 is connected to the ROM interface 18. The peripheral IO control circuit 12 connected to the peripheral IO port 11 is connected to the internal bus 16.

A flash memory may be used as the ROM 15 of the microcontroller with the built-in memory 10 having the above structure. In addition, a flash memory may be used as a single memory chip.

Figure 2:
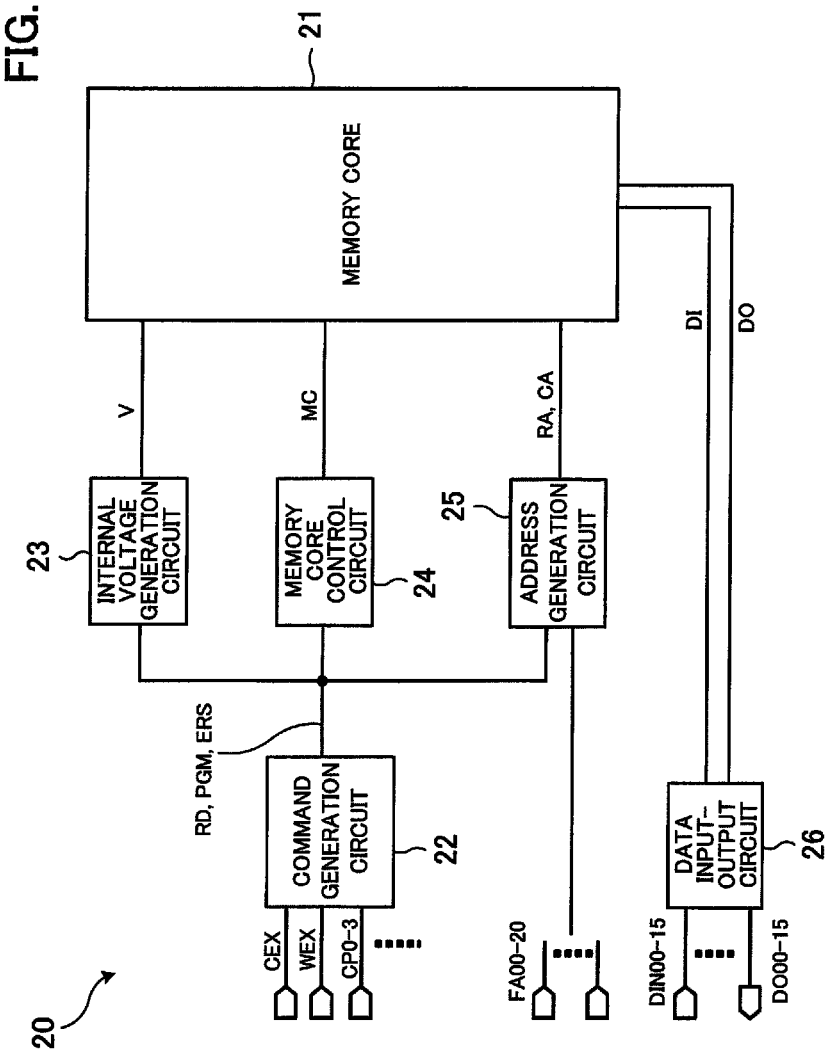
FIG. 2 indicates an example of the structure of a flash memory.

FIG. 2 indicates an example of the structure of a flash memory.

A flash memory 20 includes a memory core 21 including memory cells (memory cell transistors) and peripheral circuits. The peripheral circuits include a command generation circuit 22, an internal voltage generation circuit 23, a memory core control circuit 24, an address generation circuit 25, and a data input-output circuit 26.

The command generation circuit 22 is activated by a signal (chip enable signal) inputted from a chip enable pin CEX and generates various commands for controlling the memory core 21. On the basis of a combination of a signal (control signal) inputted from control pins CP0 through CP3 and a signal (write enable signal) inputted from a write enable pin WEX, the command generation circuit 22 generates a command. The command generation circuit 22 uses the control signal and the write enable signal to generate mode signals RD, PGM, and ERS for designating the operation modes of read (READ), program (PROGRAM), and erase (ERASE) respectively.

On the basis of the mode signal RD, PGM, or ERS, the internal voltage generation circuit 23 generates internal voltage V which the memory core 21 needs in a corresponding operation mode. For example, the internal voltage generation circuit 23 generates voltage applied to a word line, a bit line, and a source line connected to a memory cell in the memory core 21, voltage applied to a well of the memory cell, voltage at the time of precharging the bit line and a global bit line, and the like.

On the basis of the mode signal RD, PGM, or ERS, the memory core control circuit 24 generates a memory core control signal MC for controlling the memory core 21.

On the basis of an address inputted from address pins FA00 through FA20, the address generation circuit 25 generates a row address RA and a column address CA according to the mode signal RD, PGM, or ERS. A row address RA is used for selecting a word line and a source line. A column address CA is used for selecting a bit line and a global bit line.

The data input-output circuit 26 exchanges data with the outside of the flash memory 20 via input data pins DIN00 through DIN15 and output data pins DO00 through DIN15. At program operation time the data input-output circuit 26 outputs to the memory core 21 a signal DI inputted from the input data pins DIN00 through DIN15. At read operation time the data input-output circuit 26 outputs to the output data pins DO00 through DIN15 a signal DO read out from the memory core 21.

Figure 3:
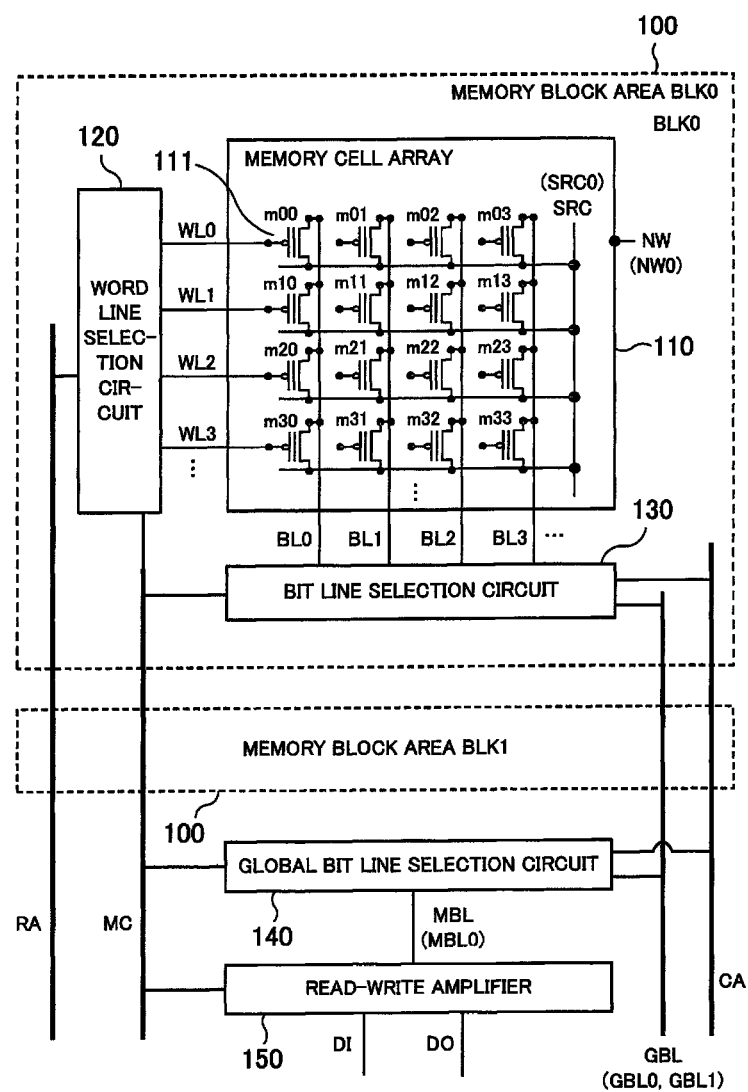
FIG. 3 indicates an example of the structure of a memory core.

FIG. 3 indicates an example of the structure of the memory core.

The memory core 21 includes a memory block area 100. The memory block area 100 includes a memory cell array 110, a word line selection circuit 120, and a bit line selection circuit 130. The memory core 21 may include a plurality of memory block areas 100 (two memory block areas BLK0 and BLK1 in this example) each having the above structure. The structure of the memory block area 100 will now be described with the memory block area BLK0 as an example.

The memory cell array 110 included in the memory block area 100 includes a plurality of memory cells 111 (at m00 through m33 in this example) arranged at positions at which word lines WL (word lines WL0 through WL3 in this example) and bit lines BL (bit lines BL0 through BL3 in this example) intersect. All the memory cells 111 included in the memory cell array 110 are connected to a common source line SRC (source line SRC0 in this example).

Each memory cell 111 is, for example, a p-channel MOS (Metal Oxide Semiconductor) transistor (PMOS). Each PMOS memory cell 111 is obtained by forming a gate electrode, a p-type source region, and a p-type drain region over a semiconductor substrate. The memory cells 111 in the memory cell array 110 are formed in an n-type well NW (n-type well NW0 in this example) in the semiconductor substrate or in n-type wells NW (n-type wells NW0 in this example) in the semiconductor substrate electrically connected to one another.

The word line selection circuit 120 illustrated in FIG. 3 selects a word line on the basis of a memory core control signal MC and a row address RA.

Figure 4:
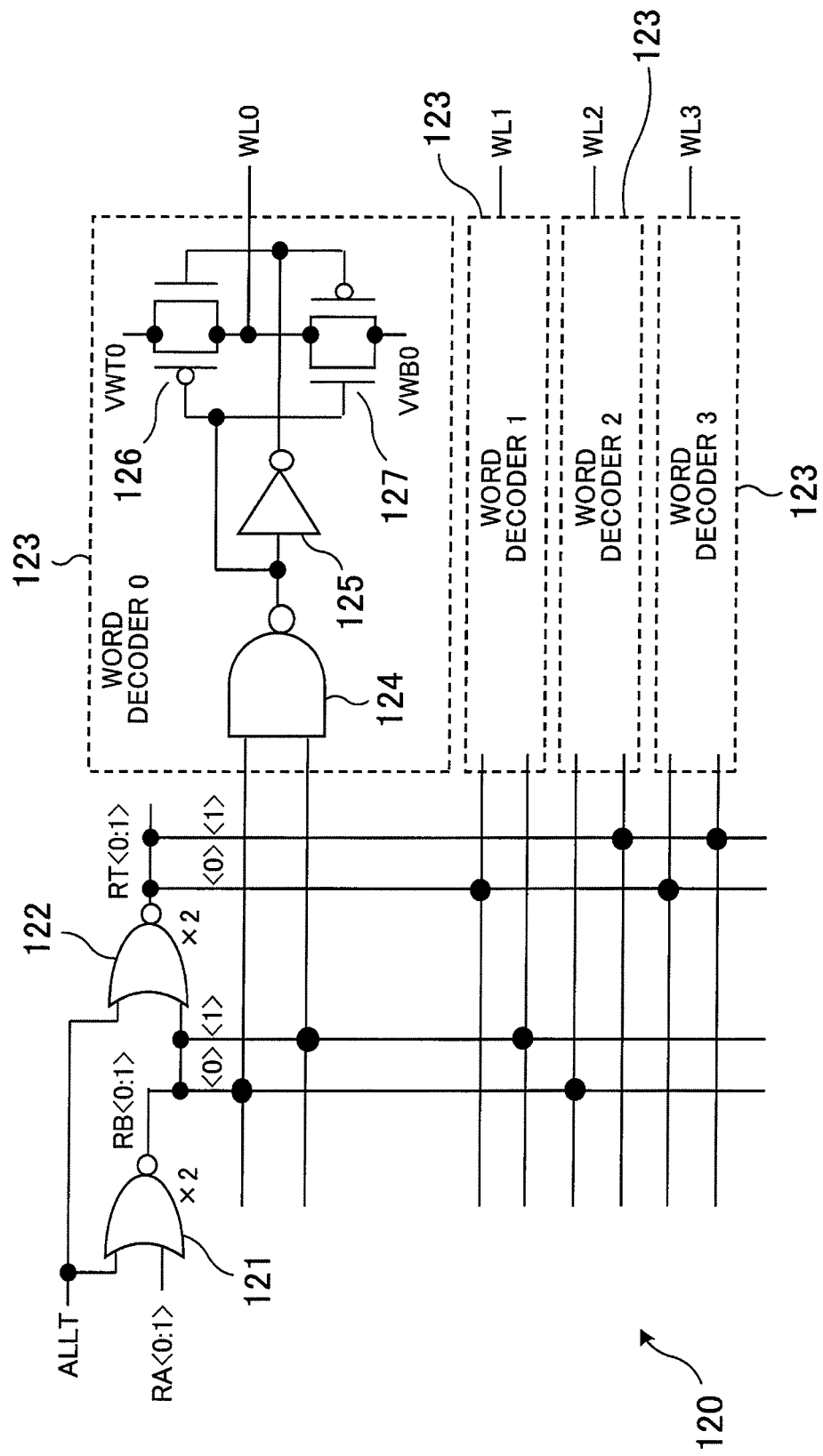
FIG. 4 indicates an example of a word line selection circuit.

FIG. 4 indicates an example of the word line selection circuit.

The word line selection circuit 120 illustrated in FIG. 4 selects one of the word lines WL0 through WL3 in accordance with a row address RA <0:1> and a signal ALLT. The word line selection circuit 120 includes a NOR gate 121, a NOR gate 122, and word decoders 123 (word decoders 0 through 3) corresponding to the word lines WL0 through WL3 respectively. Each word decoder 123 includes a NAND gate 124, a NOT gate 125, a CMOS transfer gate 126, and a CMOS transfer gate 127.

The signal ALLT and the row address RA <0:1> are inputted to the NOR gate 121 and a signal RB <0:1> is outputted from the NOR gate 121. The signal ALLT and the signal RB <0:1> are inputted to the NOR gate 122 and a signal RT <0:1> is outputted from the NOR gate 122. The signal RB <0> and the signal RB <1> are inputted to the NAND gate 124 included in the word decoder 123 corresponding to the word line WL0. Similarly, the signal RT <0> and the signal RB <1> are inputted to the NAND gate included in the word decoder 123 corresponding to the word line WL1. The signal RB <0> and the signal RT <1> are inputted to the NAND gate included in the word decoder 123 corresponding to the word line WL2. The signal RT <0> and the signal RT <1> are inputted to the NAND gate included in the word decoder 123 corresponding to the word line WL3. A signal outputted from the NAND gate 124 included in the word decoder 123 is inputted to the CMOS transfer gates 126 and 127. In addition, the signal outputted from the NAND gate 124 is inverted by the NOT gate 125 and a signal outputted from the NOT gate 125 is inputted to the CMOS transfer gates 126 and 127.

The signal ALLT inputted to the NOR gate 121 is at a low (L) level at word line selection time. For example, when the word line WL0 is selected, the row addresses RA <0> and RA<1> are at the L level, two inputs to the NAND gate 124 of the word decoder 123 are at a high (H) level, and an output from the NAND gate 124 is at the L level. As a result, the word line WL0 is connected to voltage VWT0. Two inputs to the NAND gate 124 included in the word decoder 123 corresponding to each of the word lines WL1 through WL3 not selected are at the L and H levels, respectively, or are both at the L level. As a result, the word lines WL1 through WL3 are connected to voltage VWB0. At erase operation time, the signal ALLT is at the H level and all the word lines WL0 through WL3 are connected to the voltage VWB0.

Values of the voltage VWT0 and the voltage VWB0 are set according to an operation mode. In the program operation mode, for example, the voltage VWT0 and the voltage VWB0 are set to 9 V and 0 V respectively. In the read operation mode, the voltage VWT0 and the voltage VWB0 are set to −3 V and 1.8 V respectively. In the erase operation mode, the voltage VWT0 and the voltage VWB0 are set to 0 V and −9 V respectively. The voltage VWT0 and the voltage VWB0 are set so that they will be within the range of the amplitude of an input signal and an output from a logic element.

The bit line selection circuit 130 and a global bit line selection circuit 140 illustrated in FIG. 3 will now be described. The bit line selection circuit 130 selects one of the bit lines BL0 through BL3 on the basis of a memory core control signal MC and a column address CA. The bit line selection circuit 130 connects a selected bit line to a global bit line GBL (GBL0 or GBL1) at determined voltage selected by the global bit line selection circuit 140 on the basis of the memory core control signal MC and the column address CA.

Figure 5:
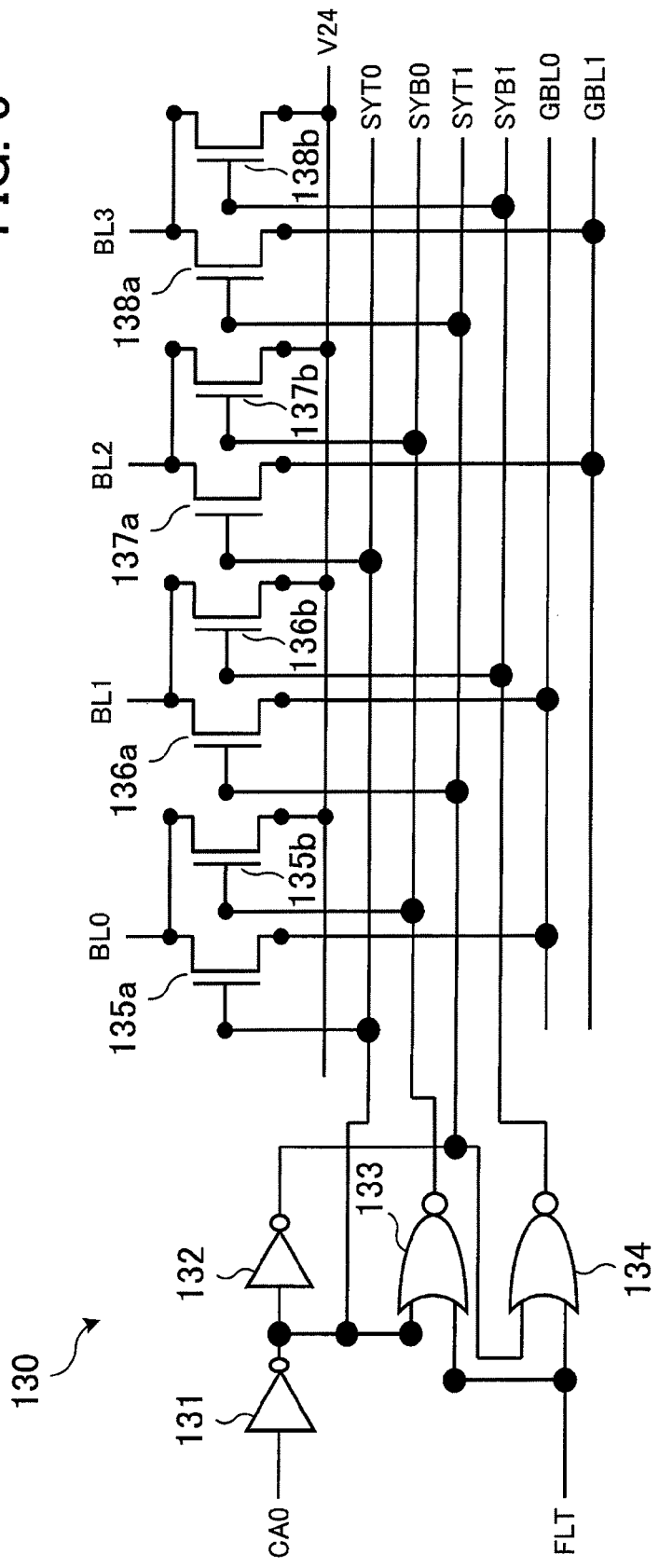
FIG. 5 indicates an example of a bit line selection circuit.
Figure 6:
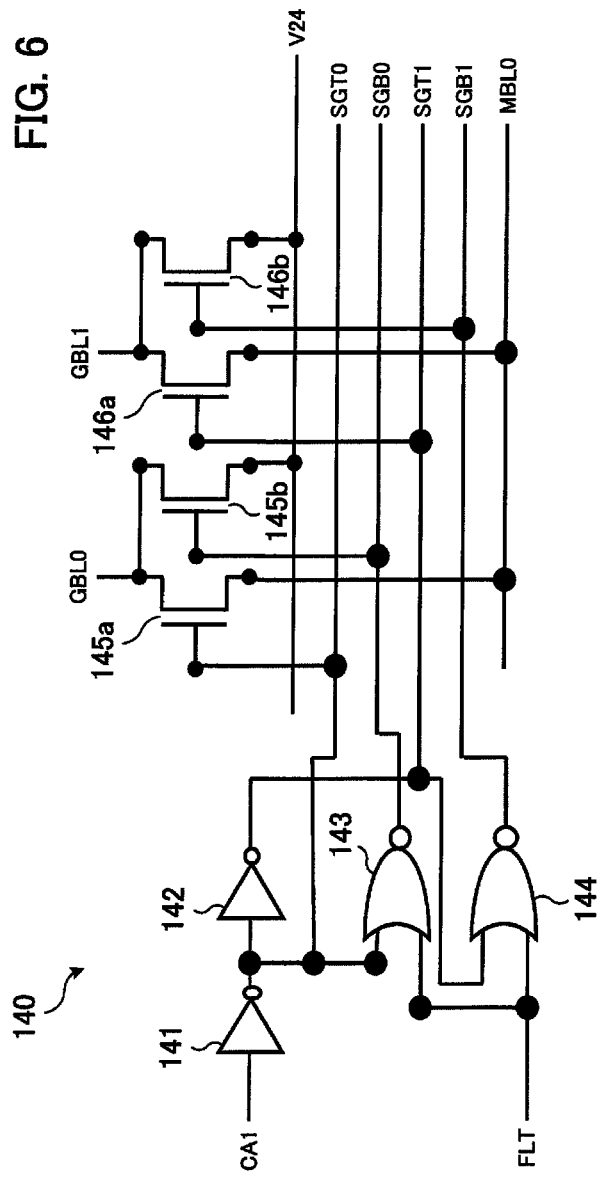
FIG. 6 indicates an example of a global bit line selection circuit.

FIG. 5 indicates an example of the bit line selection circuit. FIG. 6 indicates an example of the global bit line selection circuit.

The bit line selection circuit 130 illustrated in FIG. 5 includes a NOT gate 131, a NOT gate 132, a NOR gate 133, and a NOR gate 134. A column address CA0 is inputted to the NOT gate 131. The NOT gate 131 inverts the column address CA0. A signal outputted from the NOT gate 131 is inputted to the NOT gate 132 and the NOR gate 133 and is used as a selection signal SYT0. In addition, a signal FLT is inputted to the NOR gate 133 and an output from the NOR gate 133 is used as a selection signal SYB0. An output from the NOT gate 132 is inputted to the NOR gate 134 and is used as a selection signal SYT1. Furthermore, the signal FLT is inputted to the NOR gate 134 and an output from the NOR gate 134 is used as a selection signal SYB1.

The bit line BL0 is connected to the global bit line GBL0 via an n-channel MOS transistor (NMOS) 135a and is connected to a power supply line V24 (of 2.4 V) via an NMOS 135b. The selection signal SYT0 is inputted to a gate of the NMOS 135a and the selection signal SYB0 is inputted to a gate of the NMOS 135b. The bit line BL1 is connected to the global bit line GBL0 via an NMOS 136a and is connected to the power supply line V24 via an NMOS 136b. The selection signal SYT1 is inputted to a gate of the NMOS 136a and the selection signal SYB1 is inputted to a gate of the NMOS 136b. The bit line BL2 is connected to the global bit line GBL1 via an NMOS 137a and is connected to the power supply line V24 via an NMOS 137b. The selection signal SYT0 is inputted to a gate of the NMOS 137a and the selection signal SYB0 is inputted to a gate of the NMOS 137b. The bit line BL3 is connected to the global bit line GBL1 via an NMOS 138a and is connected to the power supply line V24 via an NMOS 138b. The selection signal SYT1 is inputted to a gate of the NMOS 138a and the selection signal SYB1 is inputted to a gate of the NMOS 138b.

The bit line selection circuit 130 illustrated in FIG. 5 connects the bit line BL0 or BL1 to the global bit line GBL0 and connects the bit line BL2 or BL3 to the global bit line GBL1. When the signal FLT is at the L level, a non-selected bit line (bit line not connected to a global bit line) is connected to the power supply line V24. In the program operation mode, voltage of a non-selected bit line is set to the voltage of the power supply line V24. On the other hand, when the signal FLT is at the H level, a non-selected bit line is not connected to the power supply line V24 and is in a high-impedance (HiZ) state. In the read operation mode or the erase operation mode, a non-selected bit line is put into the HiZ state.

Furthermore, the global bit line selection circuit 140 illustrated in FIG. 6 includes a NOT gate 141, a NOT gate 142, a NOR gate 143, and a NOR gate 144. This is the same with the above bit line selection circuit 130. A column address CA1 is inputted to the NOT gate 141. The NOT gate 141 inverts the column address CA1. A signal outputted from the NOT gate 141 is inputted to the NOT gate 142 and the NOR gate 143 and is used as a selection signal SGT0. In addition, a signal FLT is inputted to the NOR gate 143 and an output from the NOR gate 143 is used as a selection signal SGB0. An output from the NOT gate 142 is inputted to the NOR gate 144 and is used as a selection signal SGT1. Furthermore, the signal FLT is inputted to the NOR gate 144 and an output from the NOR gate 144 is used as a selection signal SGB1.

The global bit line GBL0 is connected to a main bit line MBL0 via an NMOS 145a and is connected to the power supply line V24 via an NMOS 145b. The selection signal SGT0 is inputted to a gate of the NMOS 145a and the selection signal SGB0 is inputted to a gate of the NMOS 145b. The global bit line GBL1 is connected to the main bit line MBL0 via an NMOS 146a and is connected to the power supply line V24 via an NMOS 146b. The selection signal SGT1 is inputted to a gate of the NMOS 146a and the selection signal SGB1 is inputted to a gate of the NMOS 146b.

The global bit line selection circuit 140 illustrated in FIG. 6 connects the global bit line GBL0 or GBL1 to the main bit line MBL0.

A read-write amplifier 150 illustrated in FIG. 3 will now be described. The read-write amplifier 150 includes a read amplifier and a write amplifier. The global bit line selection circuit 140 is connected to the read-write amplifier 150 via a main bit line MBL. The read amplifier reads out, on the basis of current which flows through a memory cell 111 connected thereto via a global bit line GBL, data from the memory cell 111 and outputs a signal DO on the basis of the data. The write amplifier applies determined voltage to a global bit line GBL on the basis of an inputted signal DI.

Figure 7:
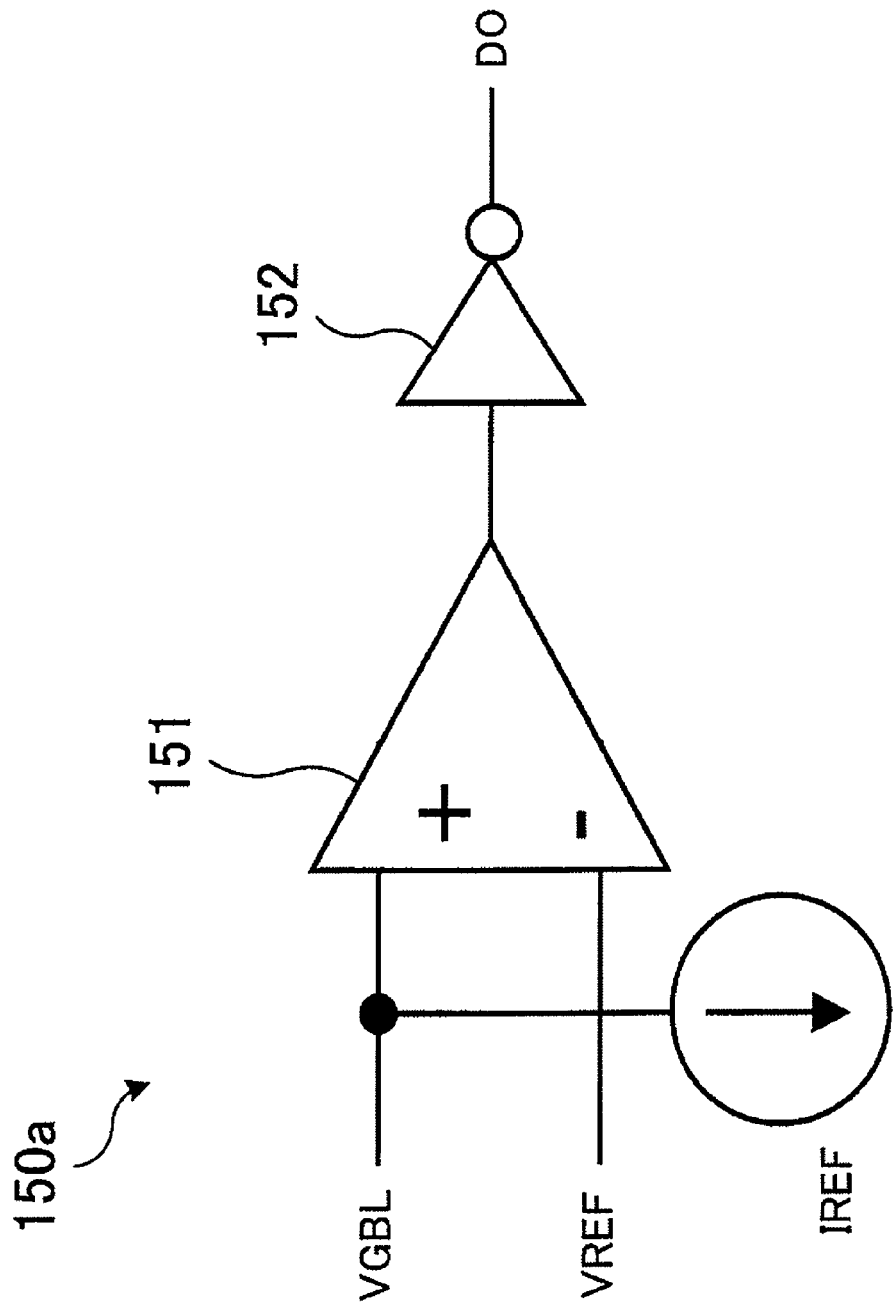
FIG. 7 indicates an example of a read amplifier.
Figure 8:
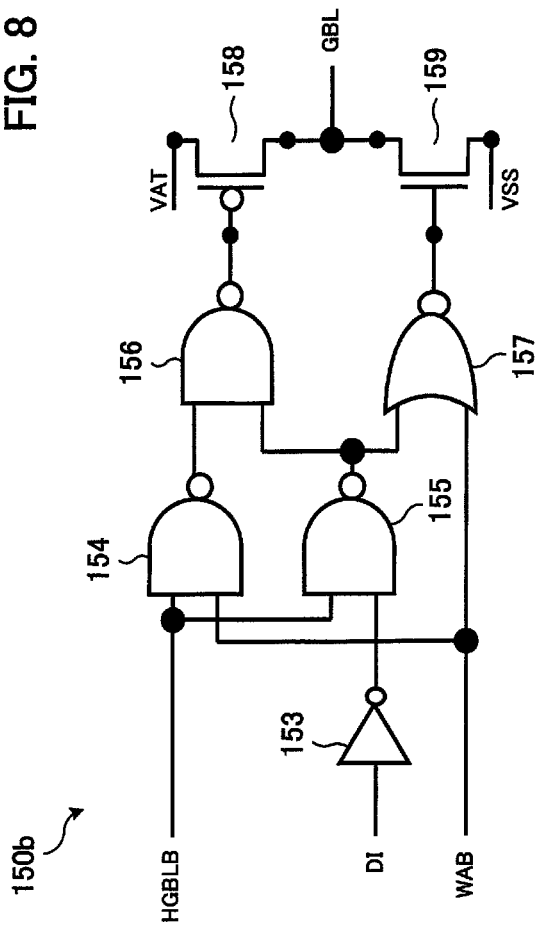
FIG. 8 indicates an example of a write amplifier.

FIG. 7 indicates an example of the read amplifier. FIG. 8 indicates an example of the write amplifier.

A read amplifier 150a illustrated in FIG. 7 includes a comparator 151 to which voltage VGBL of a global bit line GBL and reference voltage VREF are inputted and a NOT gate 152 which inverts an output from the comparator 151 and which outputs an obtained signal as a signal DO.

The read amplifier 150a activates in the read operation mode. If a memory cell 111 selected as a read target memory cell is in a programmed state in which threshold voltage Vth is high, then current flows through the memory cell 111 and electric charges are supplied to a global bit line GBL. At this time voltage VGBL of the global bit line GBL is at the H level and the signal DO at the L level is outputted from the read amplifier 150a. On the other hand, if a memory cell 111 selected as a read target memory cell is in an erased state in which threshold voltage Vth is low, then current does not flow through the memory cell 111, voltage VGBL of a global bit line GBL is at the L level, and the signal DO at the H level is outputted from the read amplifier 150a.

A write amplifier 150b illustrated in FIG. 8 includes a NOT gate 153, a NAND gate 154, a NAND gate 155, a NAND gate 156, a NOR gate 157, a PMOS 158, and an NMOS 159.

A signal DI is inputted to the NOT gate 153. A signal HGBLB and a signal WAB are inputted to the NAND gate 154. The signal HGBLB and an output from the NOT gate 153, that is to say, a signal obtained by inverting the signal DI are inputted to the NAND gate 155. An output from the NAND gate 154 and an output from the NAND gate 155 are inputted to the NAND gate 156. An output from the NAND gate 156 is inputted to a gate of the PMOS 158. An output from the NAND gate 155 and the signal WAB are inputted to the NOR gate 157. An output from the NOR gate 157 is inputted to a gate of the NMOS 159.

When the signal HGBLB is at the L level, the output from the NAND gate 156 is at the L level and a global bit line GBL is connected to voltage VAT (power supply line V24 (2.4 V)). When the global bit line GBL is precharged before read (before sense) in the read operation mode, this state arises. When the signal HGBLB is at the H level and the signal WAB is at the H level, the global bit line GBL is in the HiZ state. At read time (sense time) in the read operation mode, this state arises. In the program operation mode, the signal WAB is at the L level and the polarity of the global bit line GBL is the same as that of the signal DI. When the signal DI is at the L level, the global bit line GBL is connected to voltage VSS (earthing conductor). When the signal DI is at the H level, the global bit line GBL is connected to the voltage VAT.

The read, erase, and program operation of the flash memory 20 including the above memory core 21 illustrated in FIGS. 3 through 8 will now be described.

First the read operation will be described. Description will now be given with a case where read operation is performed on the memory cell 111 at m00 of the memory cells 111 included in the memory cell array 110 in the memory block area BLK0 illustrated in FIG. 3 as an example.

Figure 9:
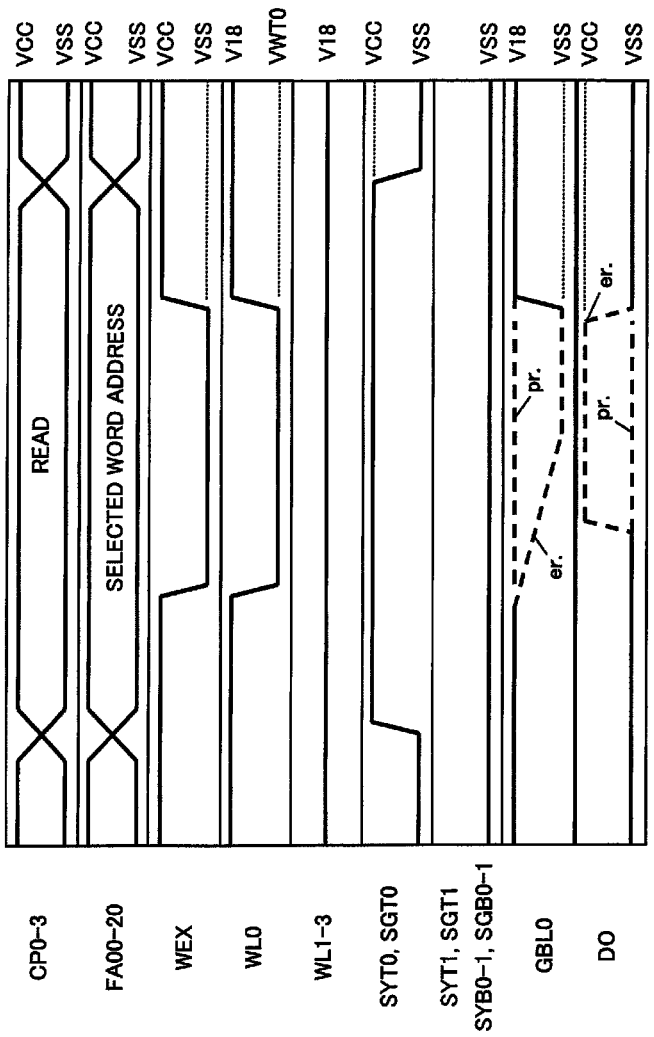
FIG. 9 indicates an example of a waveform of read operation.

FIG. 9 indicates an example of a waveform of the read operation.

When the flash memory 20 performs the read operation, the flash memory 20 sets a read command at the control pins CP0 through CP3 and enters the read operation mode. At the same time the flash memory 20 sets a selected word address at the address pins FA00 to FA20 for designating a row and a column. When voltage of a write enable signal inputted to the write enable pin WEX is decreased, a word line (word line WL0 in this example) is selected on the basis of a row address RA and voltage of the word line WL0 changes from voltage V18 (1.8 V) to negative voltage VWT0 (−3 V, for example). Voltage of the non-selected word lines WL1 through WL3 is kept at the voltage V18. The voltage of the source line SRC0 is the same as that of the non-selected word lines WL1 through WL3, that is to say, the voltage V18.

When the flash memory 20 enters the read operation mode and sets an address, a selection signal SYT0 in the bit line selection circuit 130 and a selection signal SGT0 in the global bit line selection circuit 140 change from the L level (VSS) to the H level (VCC) on the basis of a column address CA. The other selection signals SYT1, SYB0, SYB1, SGT1, SGB0, and SGB1 all remain at the L level (VSS). As a result, the bit line BL0 to which the selected memory cell 111 (at m00) is connected is connected to the global bit line GBL0 and the global bit line GBL0 is connected to the read amplifier 150a via the main bit line MBL0.

When the write enable signal inputted to the write enable pin WEX is at the H level, the global bit line GBL0 is set to the voltage V18 which is the same as the voltage of the source line SRC0. When the voltage of the word line WL0 drops from the voltage V18 to the voltage VWT0, the voltage of to the global bit line GBL0 changes according to a state of the memory cell 111 (at m00). That is to say, if the memory cell 111 (at m00) is in a programmed state (pr.) in which threshold voltage Vth is high, then current flows through the memory cell 111 (at m00) and the global bit line GBL0 is at the H level (V18). If the memory cell 111 (at m00) is in an erased state (er.) in which threshold voltage Vth is low, then current does not flow through the memory cell 111 (at m00). Electric charges are drawn out of the global bit line GBL0 by a current source included in the read amplifier 150a included in the read-write amplifier 150, and the global bit line GBL0 changes to the L level (VSS).

A signal DO changes according to the state of the global bit line GBL0. That is to say, if the memory cell 111 (at m00) is in the programmed state (pr.) and the global bit line GBL0 is at the H level, then the signal DO is at the L level (VSS). If the memory cell 111 (at m00) is in the erased state (er.) and the global bit line GBL0 is at the L level, then the signal DO is at the H level (VCC).

Next, the erase operation will be described. Description will now be given with a case where erase operation is performed on memory cells 111 included in the memory cell array 110 in the memory block area BLK0 illustrated in FIG. 3 as an example.

Figure 10:
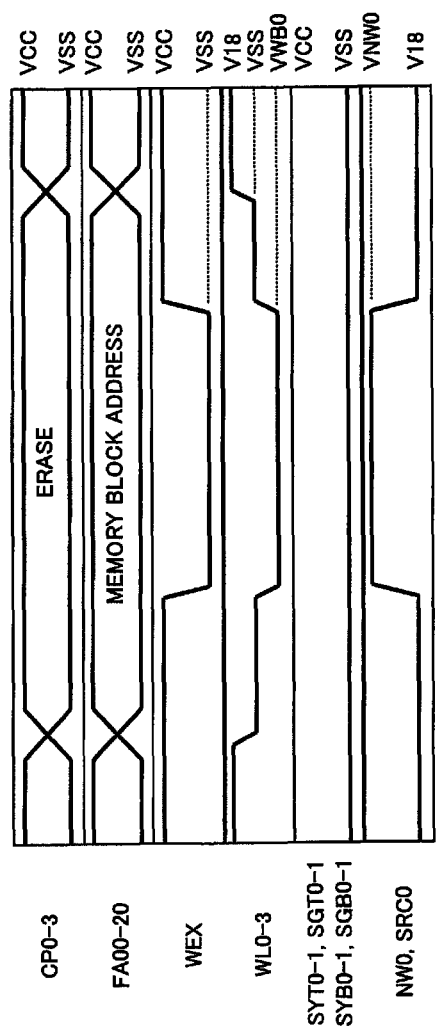
FIG. 10 indicates an example of a waveform of erase operation.

FIG. 10 indicates an example of a waveform of the erase operation.

When the flash memory 20 performs the erase operation, the flash memory 20 sets an erase command at the control pins CP0 through CP3 and enters the erase operation mode. At the same time the flash memory 20 sets a memory block address at the address pins FA00 to FA20 for designating a memory block area 100. Voltage of the word lines WL0 through WL3 in the selected memory block area 100 is set once to the voltage VSS. When voltage of a write enable signal inputted to the write enable pin WEX is decreased, the voltage of the word lines WL0 through WL3 in the selected memory block area 100 changes to negative voltage VWB0 (−9 V, for example).

All selection signals SYT0, SYT1, SYB0, SYB1, SGT0, SGT1, SGB0, and SGB1 in the bit line selection circuit 130 and the global bit line selection circuit 140 remain at the L level (VSS). As a result, the bit lines BL0 through BL3 in the selected memory block area 100 are disconnected from a global bit line GBL and the power supply line V24.

When the voltage of the word lines WL0 through WL3 in the selected memory block area 100 drops to the voltage VWB0, voltage of the n-type well NW0 and the source line SRC0 in the selected memory block area 100 is set to a high voltage VNW0 of about 9 volts. As a result, data in all the memory cells 111 in the selected memory block area 100 is erased in block.

Next, the program operation will be described. Description will now be given with a case where program operation is performed on the memory cell 111 at m00 of the memory cells 111 included in the memory cell array 110 in the memory block area BLK0 illustrated in FIG. 3 as an example.

Figure 11:
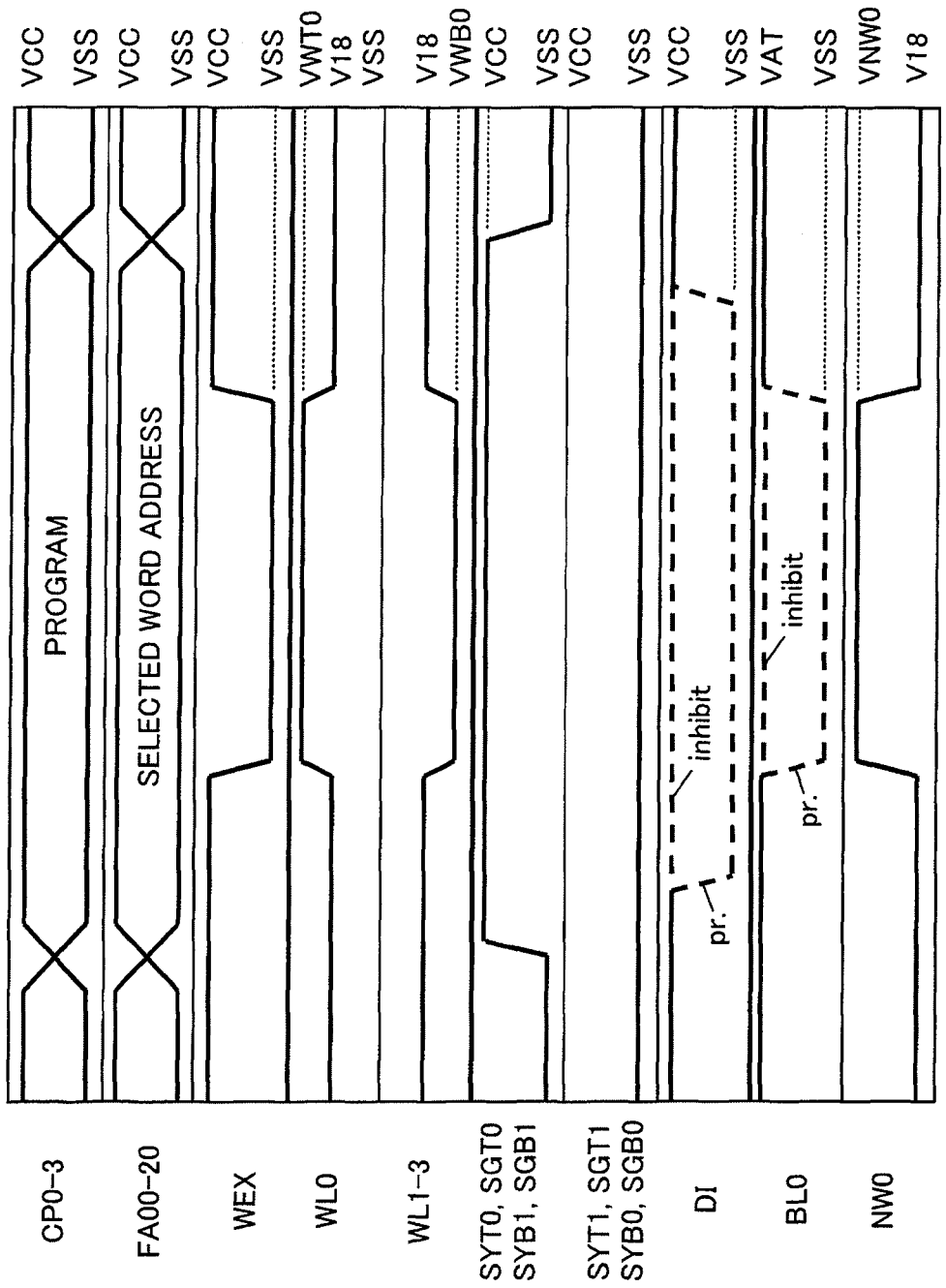
FIG. 11 indicates an example of a waveform of program operation.

FIG. 11 indicates an example of a waveform of the program operation.

When the flash memory 20 performs the program operation, the flash memory 20 sets a program command at the control pins CP0 through CP3 and enters the program operation mode. At the same time the flash memory 20 sets a selected word address at the address pins FA00 to FA20 for designating a row and a column. When voltage of a write enable signal inputted to the write enable pin WEX is decreased, a word line (word line WL0 in this example) is selected on the basis of a row address RA and voltage of the word line WL0 changes from voltage V18 (1.8 V) to positive voltage VWT0 (9 V, for example). Voltage of the non-selected word lines WL1 through WL3 changes to voltage VWB0 (0 V, for example).

When the flash memory 20 enters the program operation mode and sets an address, selection signals SYT0 and SYB1 in the bit line selection circuit 130 and selection signals SGT0 and SGB1 in the global bit line selection circuit 140 change from the L level (VSS) to the H level (VCC) on the basis of a column address CA. The other selection signals SYT1, SYB0, SGT1, and SGB0 all remain at the L level (VSS). As a result, the bit line BL0 to which the selected memory cell 111 (at m00) is connected is connected to the global bit line GBL0 and the global bit line GBL0 is connected to the write amplifier 150b via the main bit line MBL0.

When the voltage of the write enable signal inputted to the write enable pin WEX drops, the write amplifier 150b sets voltage of the global bit line GBL0 according to an inputted signal DI. With the memory cell 111 at m00 to be programmed (pr.), the signal DI at the L level (VSS) is inputted and voltage of the bit line BL0 changes to the voltage VSS (0 V). With a memory cell 111 not to be programmed (inhibit), the signal DI at the H level (VCC) is inputted and voltage of the bit line BL0 changes is voltage VAT (inhibit voltage V24 (2.4 V)) (voltage of a bit line BL to which a non-selected memory cell 111 is connected is the voltage VAT).

When the write enable signal inputted to the write enable pin WEX changes to the L level in the program operation mode, voltage of the n-type well NW0 is set to a voltage VNW0 of about 5 volts. Voltage of the source line SRC0 is set to 1.8 V in the program operation mode.

Examples of setting voltage of the word lines WL (WL0 through WL3), the bit lines BL (BL0 through BL3), the source line SRC (SRC0), and the n-type well NW (NW0) at the above read operation time, erase operation time, and program operation time are indicated in block in FIG. 12.

Disturb which occurs to a memory cell 111 in the memory cell array 110 at the above program operation time will now be described.

Figure 13:
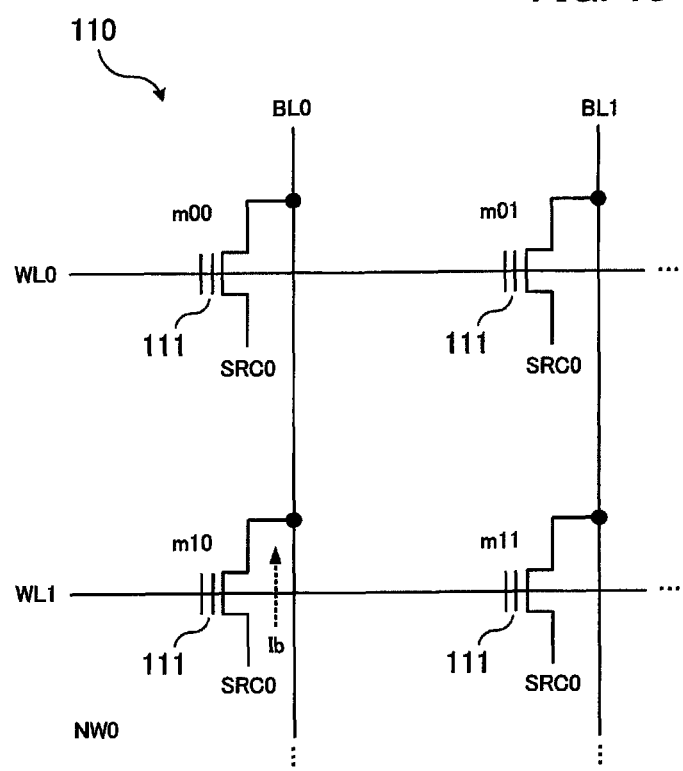
FIG. 13 is a view for describing disturb.

FIG. 13 is a view for describing disturb.

For example, it is assumed that the memory cell 111 at m00 in the memory cell array 110 illustrated in FIGS. 3 and 13 is programmed. Then the word line WL0 to which a gate of the memory cell 111 at m00 is connected is selected and voltage of the word line WL0 is set to a high value (9 V, for example). Voltage of the source line SRC0 to which the memory cell 111 at m00 is connected is set to, for example, 1.8 V. Voltage of the bit line (selected bit line) BL0 to which a drain of the memory cell 111 at m00 is connected is set to, for example, 0 V. Voltage of the other bit lines (non-selected bit lines) BL1 through BL3 is set to, for example, 2.4 V.

At this time gate disturb occurs to non-selected memory cells 111, of the memory cells 111 in the memory cell array 110, whose gates are connected to the word line WL0 and whose drains are connected to the non-selected bit lines BL1 through BL3. That is to say, gate disturb occurs to the memory cells 111 at m01, m02, and m03 (only the memory cell 111 at m01 is illustrated in FIG. 13) which are not programmed, and their threshold voltage Vth may change. In addition, if voltage of the source line SRC0 or the bit lines BL1 through BL3 to which these non-selected memory cells 111 are connected is low, their threshold voltage Vth tends to change.

Figure 14:
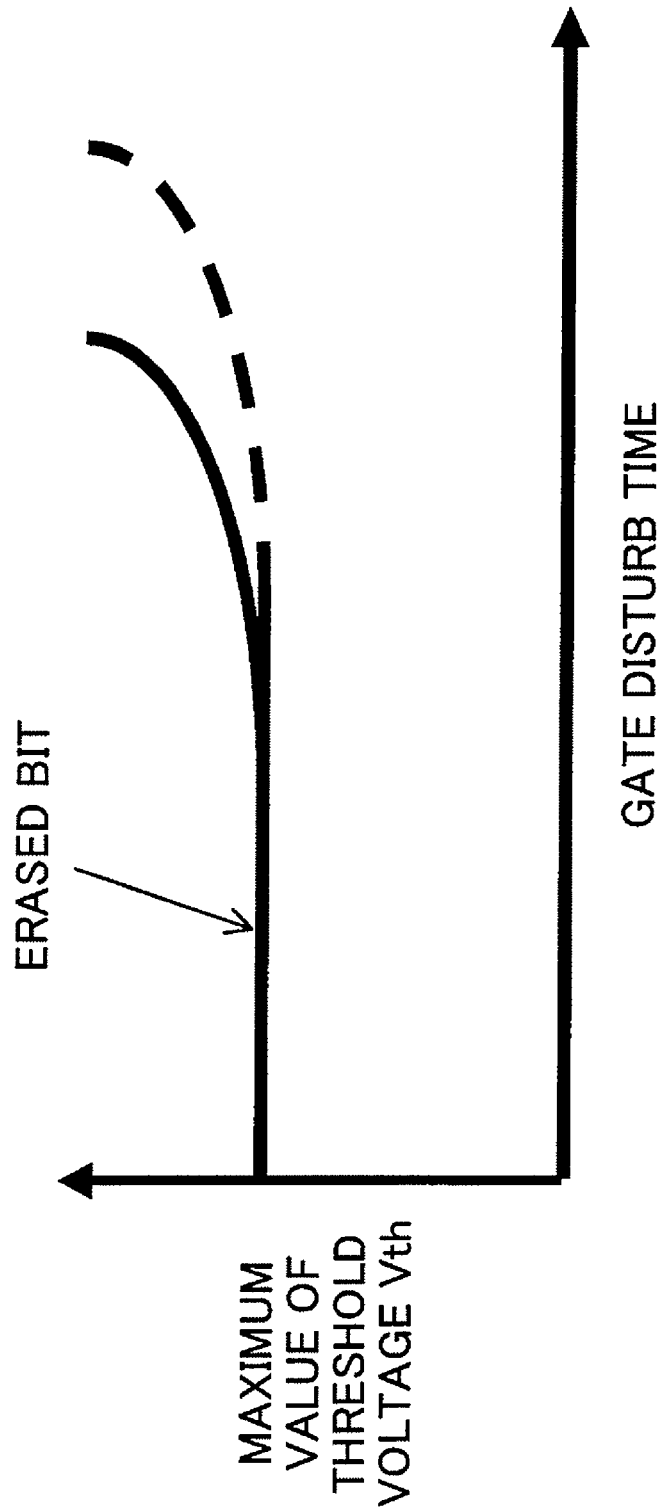
FIG. 14 is a view for describing the relationship between gate disturb time and threshold voltage.
Figure 15:
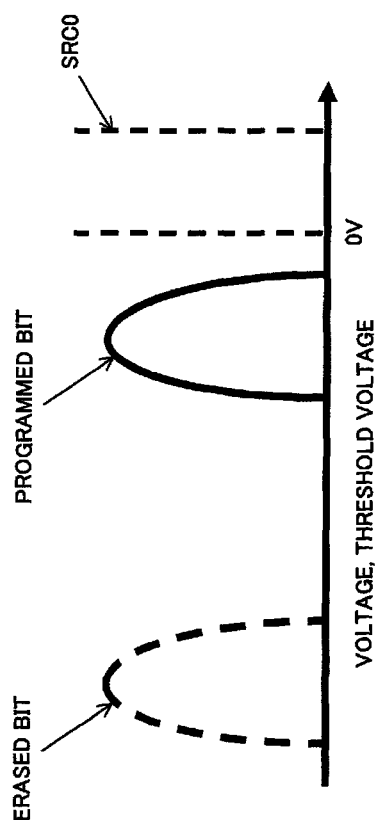
FIG. 15 is a view for describing threshold voltage distribution.

FIG. 14 is a view for describing the relationship between gate disturb time and threshold voltage. FIG. 14 indicates how threshold voltage Vth of a memory cell 111 in an erased state (erased bit) not programmed changes at the program operation time according to gate disturb time. A horizontal axis indicates time for which gate disturb occurs to the erased bit, and a vertical axis indicates a maximum value of the threshold voltage Vth of the erased bit. Furthermore, FIG. 15 is a view for describing threshold voltage distribution.

As indicated by a solid line in FIG. 14, if gate disturb time lengthens, the threshold voltage Vth of the erased bit begins to increase. If the threshold voltage Vth of the erased bit increases and approaches threshold voltage Vth of a memory cell 111 in a programmed state (programmed bit) indicated in FIG. 15, then the erased bit may be considered as a programmed bit at the read operation time.

As indicated by a dashed line in FIG. 14, if voltage of the source line SRC0 is increased, time taken for the threshold voltage Vth of the erased bit to begin to increase becomes longer. That is to say, resistance to gate disturb is improved. However, the source line SRC0 is connected to all the memory cells 111 in the memory cell array 110. Accordingly, if the voltage of the source line SRC0 is increased, voltage Vsg between a source and a gate of a memory cell 111 connected to the selected bit line BL0 increases. As a result, in the memory cells 111 at m10, m20, and m30 (only the memory cell 111 at m10 is illustrated in FIG. 13), a leakage current Ib from the source line SRC0 to the selected bit line BL0 increases or generates. If the memory cells 111 at m10, m20, and m30 are in a programmed state in which threshold voltage Vth is high, the leakage current Ib increases.

The following structures indicated as embodiments will be adopted for the memory core 21 of the flash memory 20 with the above problems taken into consideration.

A first embodiment will be described first.

Figure 16:
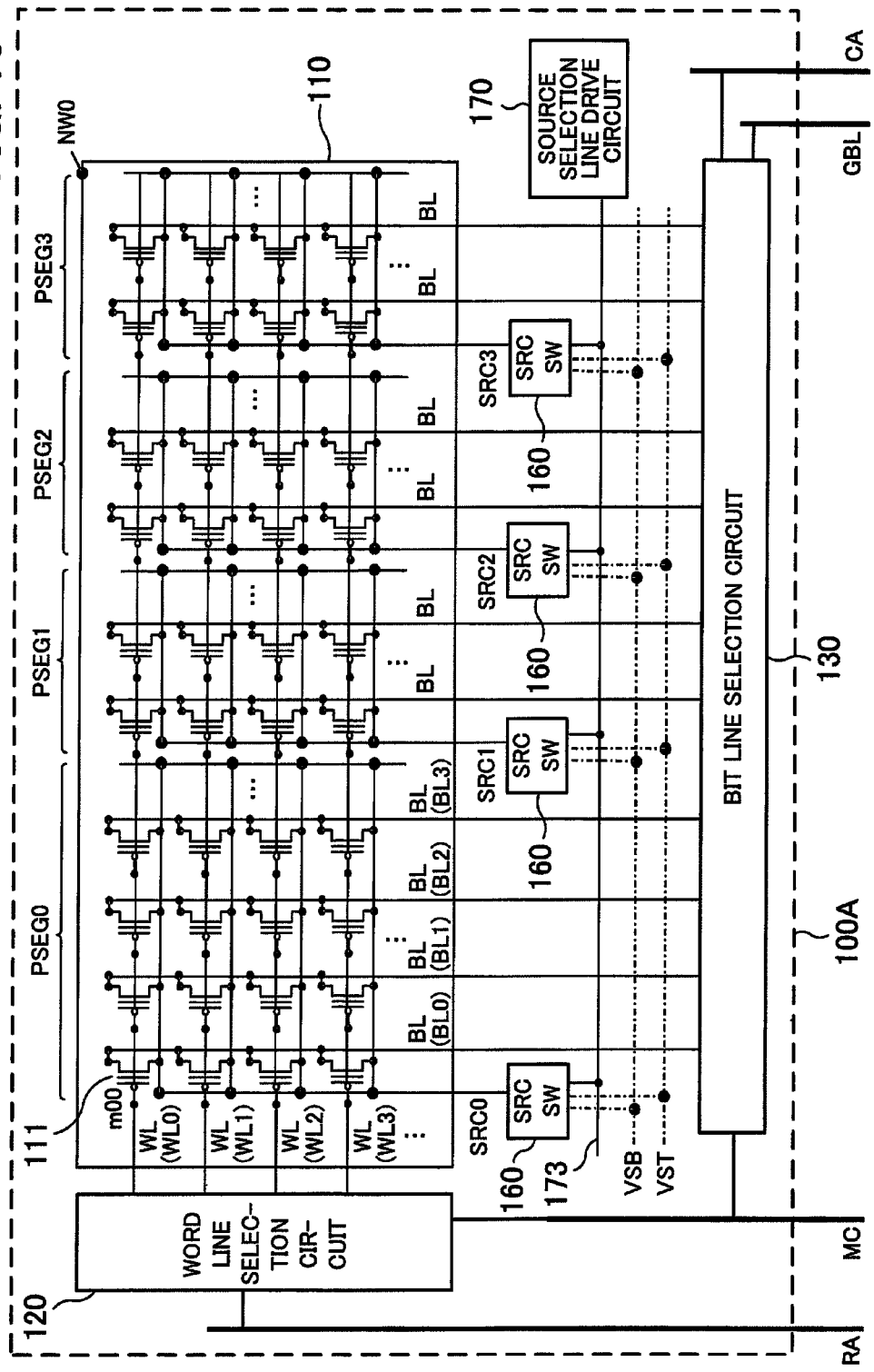
FIG. 16 indicates an example of the structure of a memory block area according to a first embodiment.

FIG. 16 indicates an example of the structure of a memory block area according to a first embodiment.

A memory block area 100A illustrated in FIG. 16 includes a word line selection circuit 120 and a bit line selection circuit 130. This is the same with the above memory block area 100. With the memory block area 100A illustrated in FIG. 16, a memory cell array 110 is divided into a plurality of blocks by the group of memory cells 111 connected to a determined number of (256, for example) bit lines BL. Each block obtained in this way by division is referred to as a memory block or a program segment PSEG. In FIG. 16, four program segments PSEG0 through PSEG3 are illustrated as an example.

The structure of a program segment PSEG will be described with the program segment PSEG0 as an example. PMOSes formed in an n-type well NM (NW0 in this example) at positions at which word lines WL (WL0 through WL3 in this example) and bit lines BL (BL0 through BL3 in this example) intersect are arranged as memory cells 111. A gate and a drain of a PMOS memory cell 111 are connected to a word line WL and a bit line BL respectively. A source of each PMOS memory cell 111 included in the program segment PSEG0 is connected to a common source line SRC0.

The other program segments PSEG1 through PSEG3 have the same structure that the program segment PSEG0 has. Memory cells 111 included in the program segments PSEG1 through PSEG3 are connected to common source lines SRC1 through SRC3 respectively. The source lines SRC0 through SRC3 in the program segments PSEG0 through PSEG3 are separated from one another and are not directly connected to one another. Voltage of the source lines SRC0 through SRC3 is set to voltage VST (1.8 V, for example) or voltage VSB (2.4 V, for example) by source line switches (SRCSW) 160 respectively. Each source line switch 160 is connected to a source selection line drive circuit 170 via a source selection line 173. Furthermore, the word lines WL are shared by the program segments PSEG0 through PSEG3.

Figure 17:
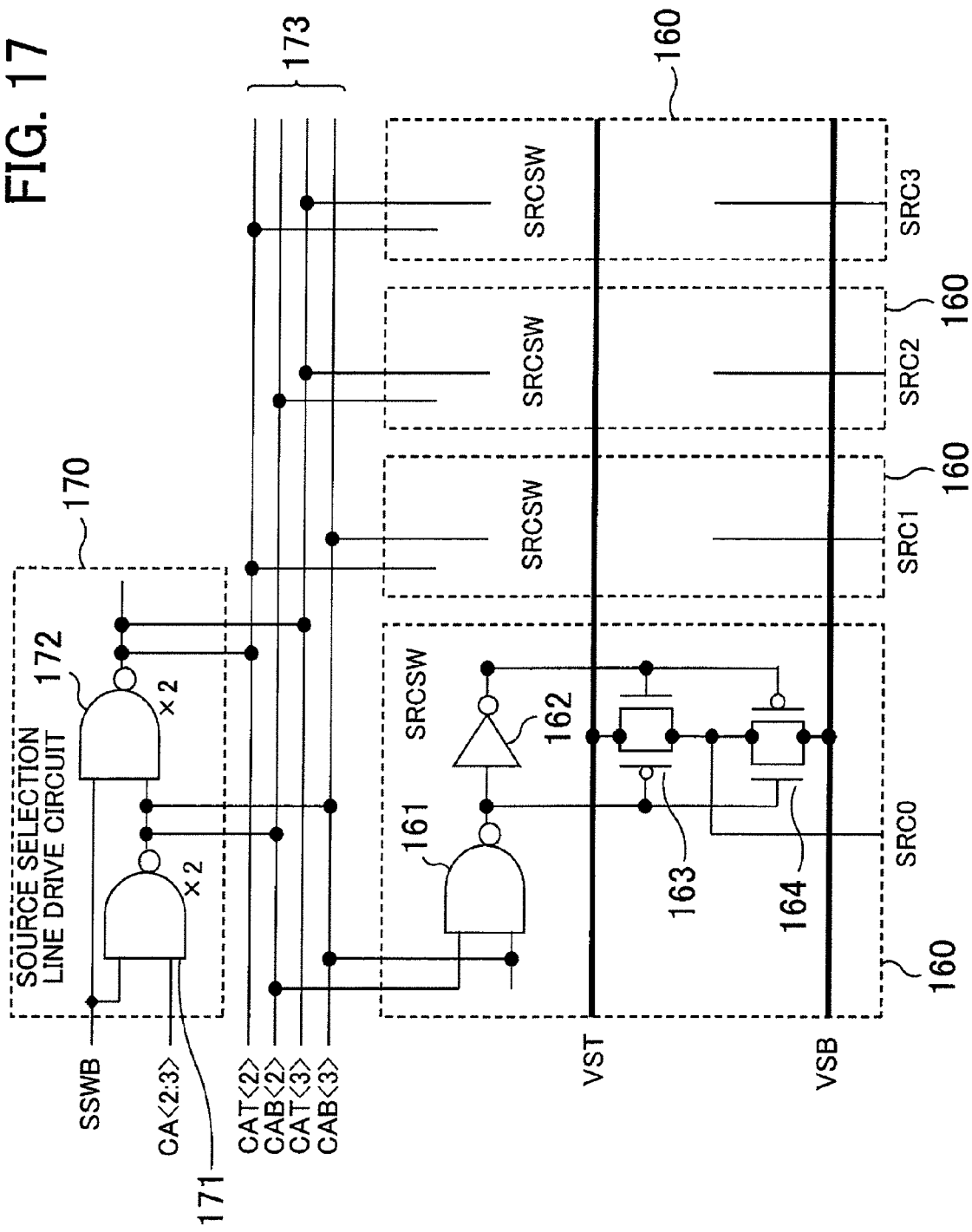
FIG. 17 indicates an example of a source line switch and a source selection line drive circuit in the first embodiment.

FIG. 17 indicates an example of the source line switch and the source selection line drive circuit in the first embodiment.

The structure of a source line switch SRCSW will now be described with the source line switch 160 connected to the source line SRC0 in the program segment PSEG0 as an example. In FIG. 17, the internal structure of the source line switches 160 connected to the source lines SRC1 through SRC3 in the program segments PSEG1 through PSEG3, respectively, is not illustrated.

The source line switch 160 includes a NAND gate 161, a NOT gate 162, a CMOS transfer gate 163, and a CMOS transfer gate 164. The source selection line drive circuit 170 includes a NAND gate 171 and a NAND gate 172.

At program operation time a signal SSWB and a column address CA <2:3> for designating a program segment PSEG are inputted to the NAND gate 171 of the source selection line drive circuit 170. The signal SSWB and a signal CAB <2:3> outputted from the NAND gate 171 are inputted to the NAND gate 172. A signal CAT <2:3> is outputted from the NAND gate 172. The signal CAB <2> and the signal CAB <3> outputted from the source selection line drive circuit 170 are inputted to the NAND gate 161 of the source line switch 160 connected to the source line SRC0. A signal outputted from the NAND gate 161 and a signal outputted from the NOT gate 162, that is to say, a signal obtained by inverting the signal outputted from the NAND gate 161 are inputted to the CMOS transfer gates 163 and 164.

The signal CAT <2> and the signal CAB <3> outputted from the source selection line drive circuit 170 are inputted to the source line switch 160 connected to the source line SRC1. The signal CAB <2> and the signal CAT <3> outputted from the source selection line drive circuit 170 are inputted to the source line switch 160 connected to the source line SRC2. The signal CAT <2> and the signal CAT <3> outputted from the source selection line drive circuit 170 are inputted to the source line switch 160 connected to the source line SRC3. The flow of signal processing performed in these source line switches 160 is the same as that of signal processing performed in the source line switch 160 connected to the above source line SRC0.

For example, if the program segment PSEG0 is selected from among the program segments PSEG0 through PSEG3 in program operation, then the source line SRC0 included in the program segment PSEG0 is selected and voltage of the source line SRC0 is set to voltage VST. Voltage of the source lines SRC1 through SRC3 included in the non-selected program segments PSEG1 through PSEG3, respectively, is set to voltage VSB. The voltage VSB is higher than the voltage VST. For example, the voltage VST is 1.8 V and the voltage VSB is 2.4 V.

In the memory block area 100A a memory cell 111 to be programmed is selected from one of the program segments PSEG0 through PSEG3.

Figure 18:
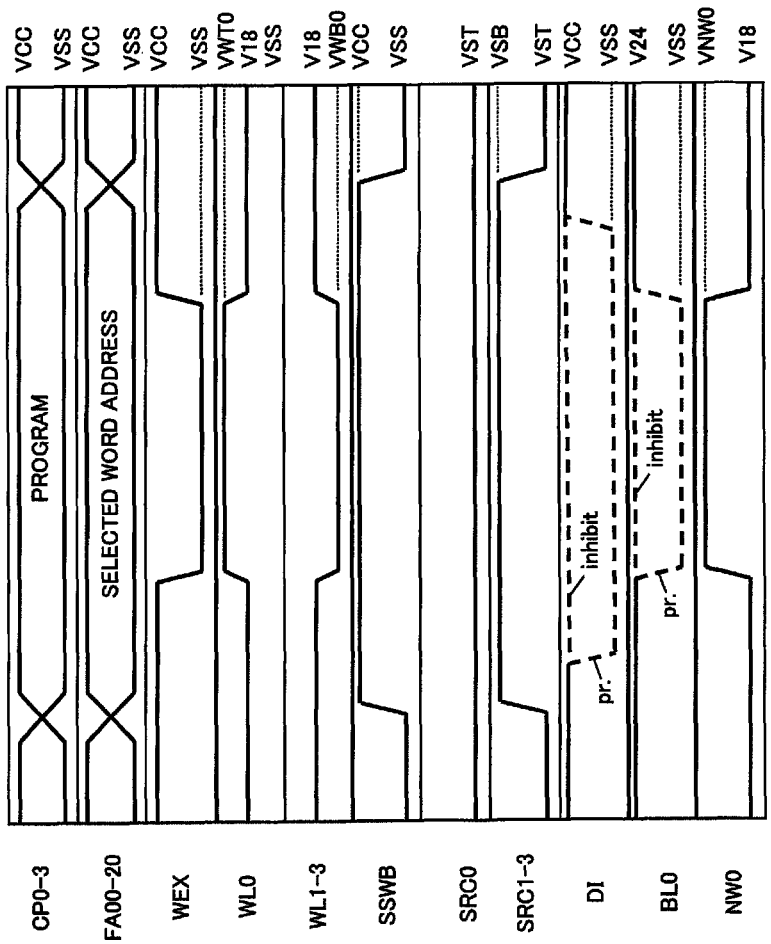
FIG. 18 indicates an example of the waveform of program operation in the first embodiment.

FIG. 18 indicates an example of the waveform of program operation in the first embodiment.

Description will now be given with a case where program operation is performed on a memory cell 111 (at m00), of the memory cells 111 included in the program segment PSEG0 of the memory block area 100A illustrated in FIG. 16, connected to the word line WL0 and the bit line BL0 as an example.

Operations in the memory block area 100A other than the operation of selecting the source lines SRC0 through SRC3 are the same as those indicated in FIG. 11.

When the flash memory 20 enters the program operation mode and sets an address, a signal SSWB changes to the H level. Voltage of the source line SRC0 in the selected program segment PSEG0 is set to voltage VST (V18 (1.8 V) in this example) on the basis of a column address CA. Voltage of the source lines SRC1 through SRC3 included in the non-selected program segments PSEG1 through PSEG3, respectively, is set to voltage VSB (V24 (2.4 V) in this example).

In the memory block area 100A, voltage of the source line SRC0 included in the selected program segment PSEG0 is set to the voltage VST and voltage of the source lines SRC1 through SRC3 included in the non-selected program segments PSEG1 through PSEG3, respectively, is set to the higher voltage VSB. Accordingly, voltage of sources of memory cells 111 in the non-selected program segments PSEG1 through PSEG3 connected to the selected word line WL0 is higher than voltage of sources of memory cells 111 in the selected program segment PSEG0. As a result, a change in threshold voltage Vth due to gate disturb hardly occurs in the memory cells 111 in the non-selected program segments PSEG1 through PSEG3 connected to the selected word line WL0.

In addition, it is desirable not to select a memory cell 111 to be programmed from the non-selected program segments PSEG1 through PSEG3 (there is no selected bit line BL in the non-selected program segments PSEG1 through PSEG3) in the memory block area 100A. As a result, an increase in or the generation of leakage current from the source lines SRC1 through SRC3 to a bit line BL in the non-selected program segments PSEG1 through PSEG3, respectively, is checked.

On the other hand, memory cells 111 in the selected program segment PSEG0 in the memory block area 100A connected to the selected word line WL0 are connected to the source line SRC0 the voltage of which is set to the voltage VST. That is to say, source voltage for the memory cells 111 in the selected program segment PSE0 connected to the selected word line WL0 is lower than source voltage for memory cells 111 in the non-selected program segments PSEG1 through PSEG3. Therefore, the memory cells 111 in the selected program segment PSEG0 connected to the selected word line WL0 may be influenced by gate disturb. However, even if the memory cells 111 in the selected program segment PSEG0 connected to the selected word line WL0 are influenced by gate disturb, gate disturb time is one-fourth of time for which all the memory cells 111 in the memory cell array 110 connected to a common source line (corresponding to the above memory block area 100) are influenced by gate disturb. As a result, a change in threshold voltage Vth caused by gate disturb is checked.

As has been described, the voltage of the source line SRC0 in the selected program segment PSEG0 in the memory block area 100A is set to the voltage VST and source voltage for the memory cells 111 in the selected program segment PSEG0 is made low. This prevents an increase in or the generation of leakage current from the source line SRC0 to the selected bit line BL0.

In the memory block area 100A, as has been described, it is possible to control a change in threshold voltage Vth of the memory cells 111 connected to the selected word line WL0 which is caused by gate disturb, while preventing an increase in leakage current from the source line SRC0 to the selected bit line BL0.

As stated above, a memory cell 111 to be programmed is selected from one of the program segments PSEG0 through PSEG3 in the memory block area 100A.

Figure 19:
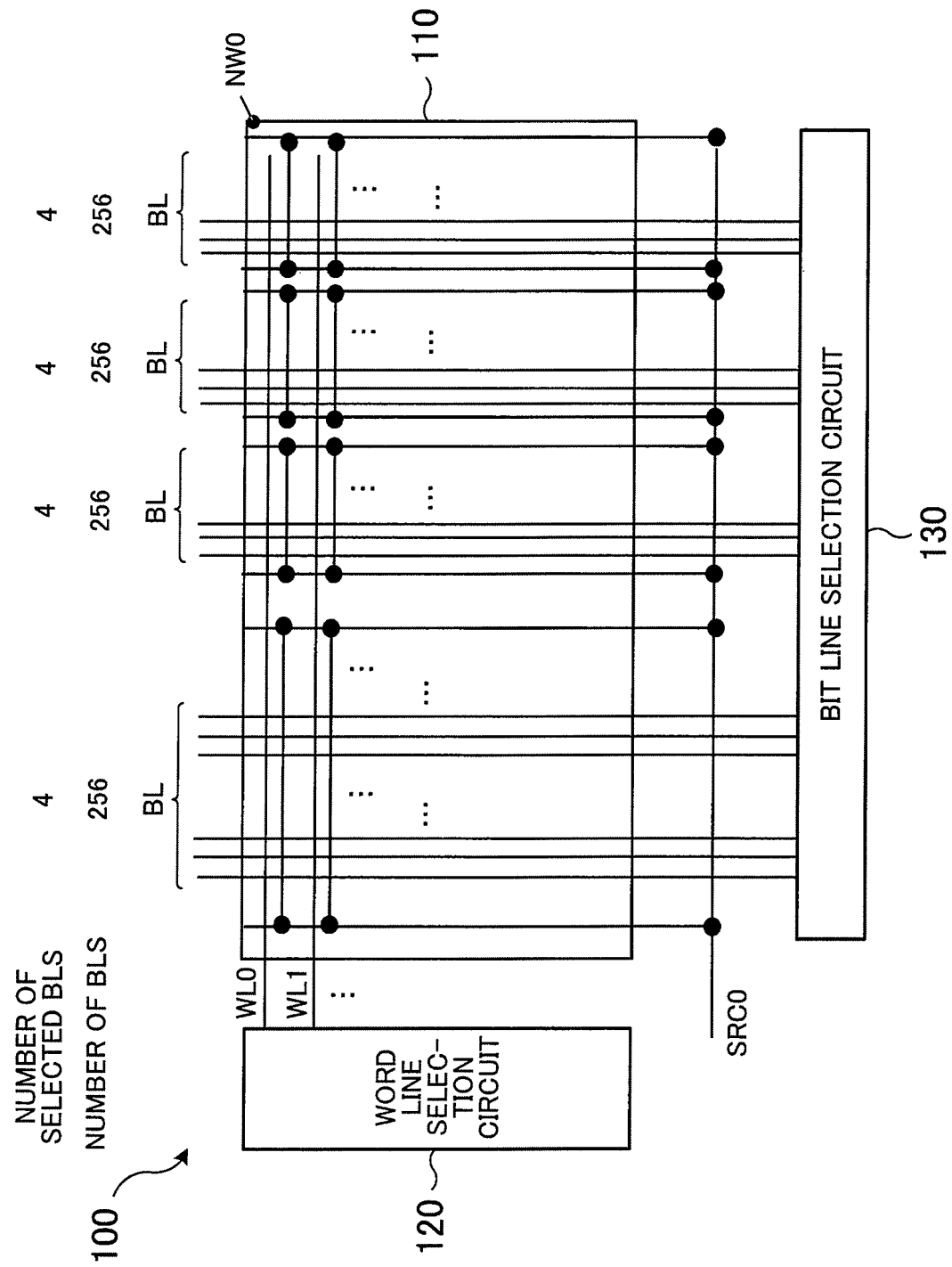
FIG. 19 is a view for describing bit line selection in a memory block area not divided into program segments.
Figure 20:
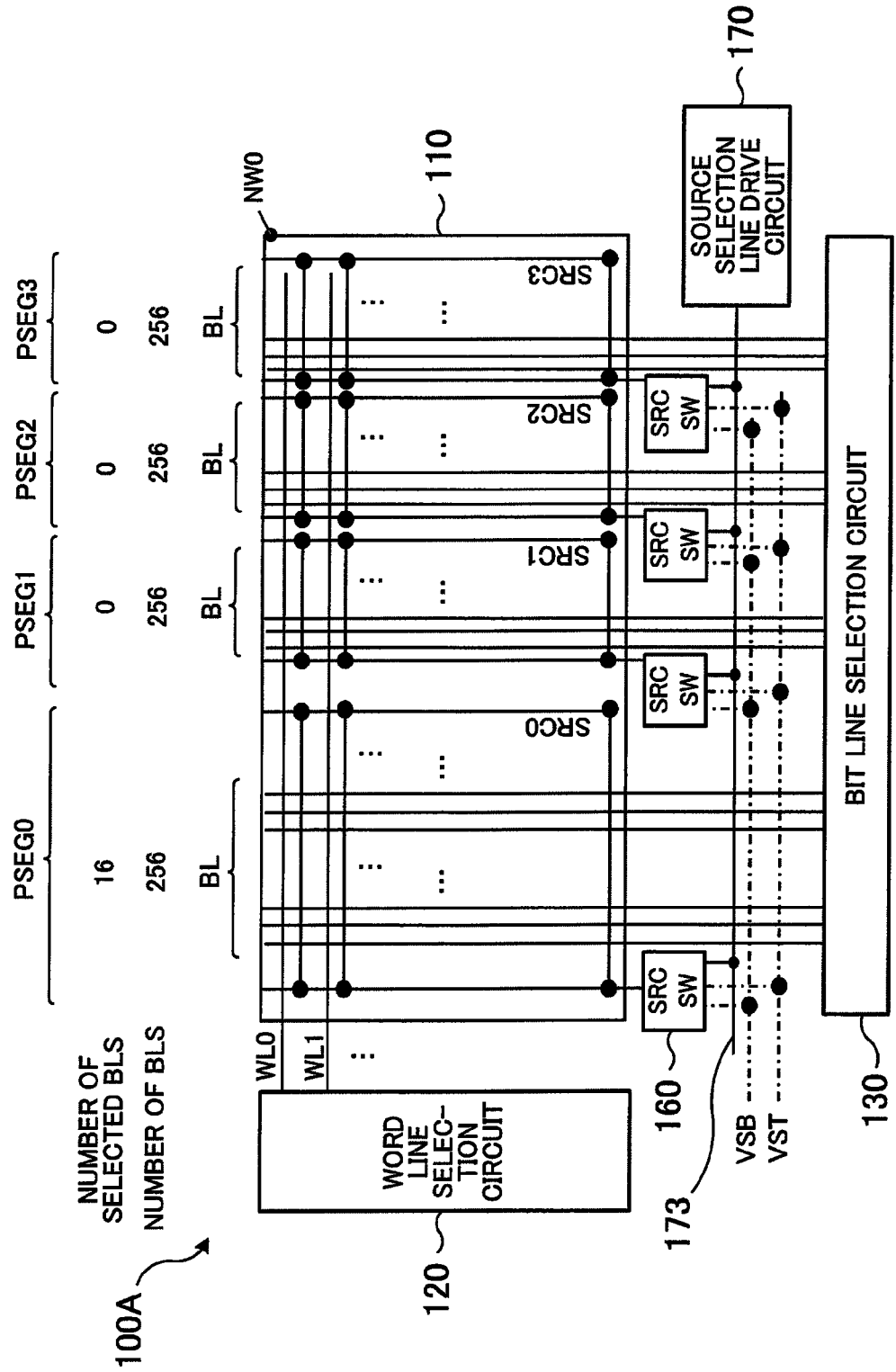
FIG. 20 is a view for describing bit line selection in the memory block area according to the first embodiment.

FIG. 19 is a view for describing bit line selection in the memory block area not divided into program segments. FIG. 20 is a view for describing bit line selection in the memory block area according to the first embodiment.

FIG. 19 illustrates the above memory block area 100 (illustrated in FIG. 3) not divided into program segments PSEG0 through PSEG3 and does not illustrate the memory cells 111 for the sake of simplicity. FIG. 19 illustrates the memory block area 100 connected to 1024 bit lines BL. In this memory block area 100 a plurality of bit lines BL may be selected (a plurality of memory cells 111 may be programmed). For example, if 16 bit lines BL are selected, 4 bit lines BL are selected for every 256 bit lines BL.

FIG. 20 illustrates the above memory block area 100A divided into the four program segments PSEG0 through PSEG3 by 256 bit lines BL and does not illustrate the memory cells 111 for the sake of simplicity. If a plurality of bit lines BL are selected (a plurality of memory cells 111 are programmed) in the memory block area 100A at program operation time, then the plurality of bit lines BL are selected from one program segment PSEG. FIG. indicates a case where 16 bit lines BL are selected only from the program segment PSEG0.

By doing so, the remaining program segments PSEG1 through PSEG3 can be made non-selected program segments and voltage of the source lines SRC1 through SRC3 can be made higher than voltage of the source line SRC0 in the selected program segment PSEG0. As stated above, this makes it possible to control a change in threshold voltage Vth of the memory cells 111 connected to the selected word line WL0 which is caused by gate disturb, while preventing an increase in leakage current from the source line SRC0 to the selected bit line BL0.

At read operation time or erase operation time in the above memory block area 100A, the signal SSWB (indicated in FIG. 17) inputted to the source selection line drive circuit 170 is at the L level and voltage of all the source lines SRC0 through SRC3 is set to the voltage VST. The voltage VST is 1.8 V and 9 V at the read operation time and the erase operation time respectively. Read operation performed on each memory cell 111 in the memory block area 100A and erase operation performed on all the memory cells 111 in the memory block area 100A (batch erase) are the same as those indicated in FIGS. 9 and 10 respectively.

A second embodiment will now be described.

A second embodiment differs from the above first embodiment in that the following source line switch SRCSW is used.

Figure 21:
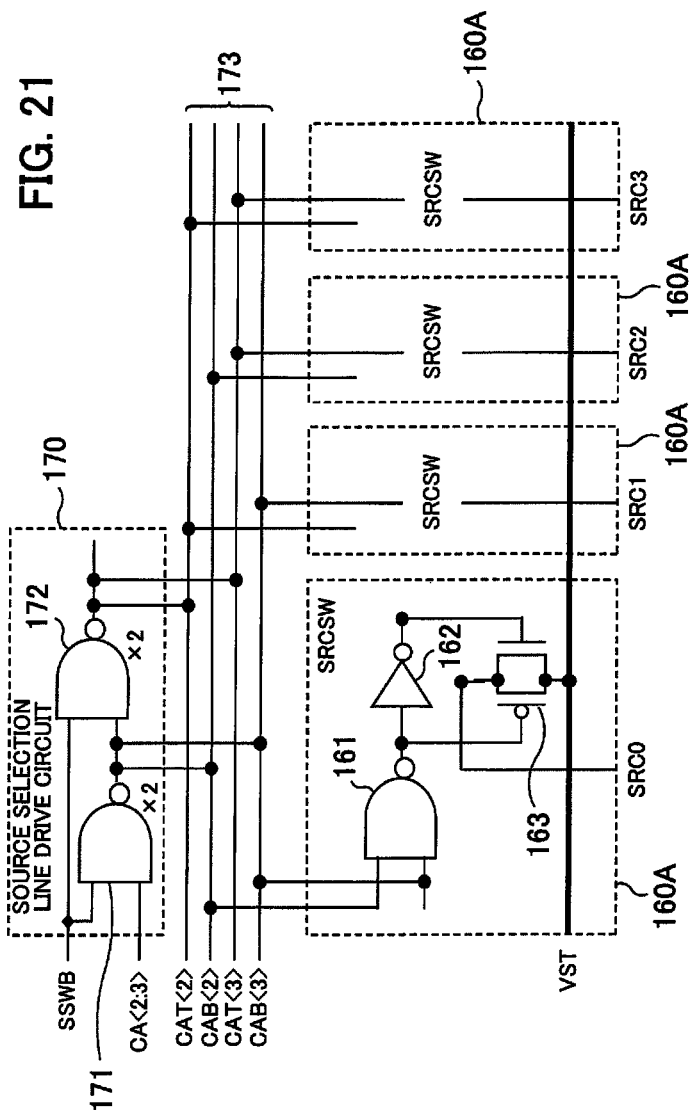
FIG. 21 indicates an example of a source line switch and a source selection line drive circuit in a second embodiment.

FIG. 21 indicates an example of a source line switch and a source selection line drive circuit in a second embodiment.

The structure of a source line switch SRCSW will be described with a source line switch 160A connected to a source line SRC0 in a program segment PSEG0 as an example. For convenience, FIG. 21 does not illustrate the internal structure of source line switches 160A connected to source lines SRC1 through SRC3 in program segments PSEG1 through PSEG3 respectively.

With the source line switch 160A illustrated in FIG. 21, unlike the above first embodiment, a non-selected source line SRC is not connected to voltage VSB (V24). Voltage of a non-selected source line SRC is increased by capacitance coupling between an n-type well NW and a source junction of a memory cell 111. The source line switch 160A includes a NAND gate 161, a NOT gate 162, and a CMOS transfer gate 163. The structure of a source selection line drive circuit 170 is the same as that of the source selection line drive circuit 170 illustrated in FIG. 17.

A signal CAB <2> and a signal CAB <3> outputted from the source selection line drive circuit 170 are inputted to the NAND gate 161 included in the source line switch 160A connected to the source line SRC0. A signal outputted from the NAND gate 161 and a signal outputted from the NOT gate 162, that is to say, a signal obtained by inverting the signal outputted from the NAND gate 161 are inputted to the CMOS transfer gate 163.

A signal CAT <2> and the signal CAB <3> are inputted to the source line switch 160A connected to the source line SRC1. The signal CAB <2> and a signal CAT <3> are inputted to the source line switch 160A connected to the source line SRC2. The signal CAT <2> and the signal CAT <3> are inputted to the source line switch 160A connected to the source line SRC3. The flow of signal processing performed in these source line switches 160A is the same as that of signal processing performed in the source line switch 160A connected to the above source line SRC0.

Figure 22:
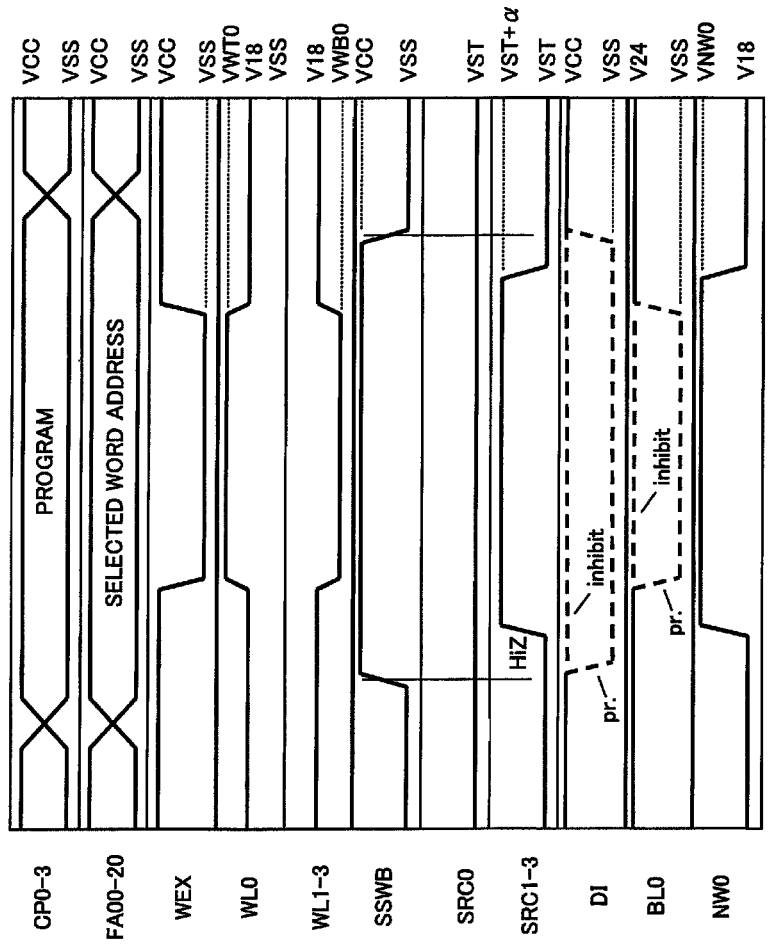
FIG. 22 indicates an example of the waveform of program operation in the second embodiment.

FIG. 22 indicates an example of the waveform of program operation in the second embodiment.

Description will now be given with a case where program operation is performed on the memory cell 111 (at m00), of the memory cells 111 included in the program segment PSEG0 of the memory block area 100A illustrated in FIG. 16, connected to the word line WL0 and the bit line BL0 as an example.

Operations in the memory block area 100A with the above source line switches 160A other than the operation of selecting the source lines SRC0 through SRC3 are the same as those indicated in FIG. 18.

A flash memory 20 enters the program operation mode. Before voltage of an n-type well NW0 is increased after that, a signal SSWB is at the L level, voltage of all the source lines SRC0 through SRC3 is set to voltage VST (V18 (1.8 V)), and all the source lines SRC0 through SRC3 are precharged. After the elapse of determined time (after all the source lines SRC0 through SRC3 are precharged), the signal SSWB is changed to the H level. The selected source line SRC0 is set to the voltage VST on the basis of a column address CA. The non-selected source lines SRC1 through SRC3 go into the HiZ state. After that, the voltage of the n-type well NW0 is increased from the voltage V18 to voltage VNW0. At this time voltage of the non-selected source lines SRC1 through SRC3 in the HiZ state is increased from the voltage VST to voltage VST+α due to capacitance coupling between the n-type well NW0 and a source junction of a memory cell 111. After the program operation, the voltage of the n-type well NW0 decreases to the voltage V18 and the voltage of the non-selected source lines SRC1 through SRC3 decreases due to the capacitance coupling. After that, the signal SSWB is changed to the L level and the voltage of all the source lines SRC0 through SRC3 is set to the voltage VST.

With the above memory block area 100 (memory block area BLK0 illustrated in FIG. 3) not divided into program segments PSEG0 through PSEG3, all the memory cells 111 included in the memory block area 100 are connected to the common source line SRC0. Accordingly, when voltage of the source line SRC0 is increased by capacitance coupling between the n-type well NW and a source junction of a memory cell 111, the voltage of the source line SRC0 after the increase may not be maintained due to a leakage current from the source line SRC0 to the selected bit line BL0.

With the above memory block area 100A divided into the program segments PSEG0 through PSEG3, on the other hand, there are no bit lines BL which are selected and which are set to 0 V in the program segments PSEG1 through PSEG3 including the non-selected source lines SRC1 through SRC3 respectively. This prevents increased voltage of the source lines SRC1 through SRC3 from dropping due to a leakage current which flows through memory cells 111.

At read operation time or erase operation time in the above memory block area 100A in which the source line switches 160A are used, the signal SSWB (indicated in FIG. 21) inputted to the source selection line drive circuit 170 is at the L level and voltage of all the source lines SRC0 through SRC3 is set to the voltage VST. The voltage VST is 1.8 V and 9 V at the read operation time and the erase operation time respectively. Read operation performed on each memory cell 111 in the memory block area 100A and erase operation performed on all the memory cells 111 in the memory block area 100A (batch erase) are the same as those indicated in FIGS. 9 and 10 respectively.

In the second embodiment voltage of an input signal, voltage of an output at the H level from a logic element, and a back bias applied to a PMOS are set so that they will be higher than increased voltage of a source line SRC.

A third embodiment will now be described.

In the example of the above first embodiment, the memory block area 100A includes the 1024 bit lines BL and is divided into the four program segments PSEG by 256 bit lines BL. The number of program segments PSEG after division is not limited to four.

Figure 23:
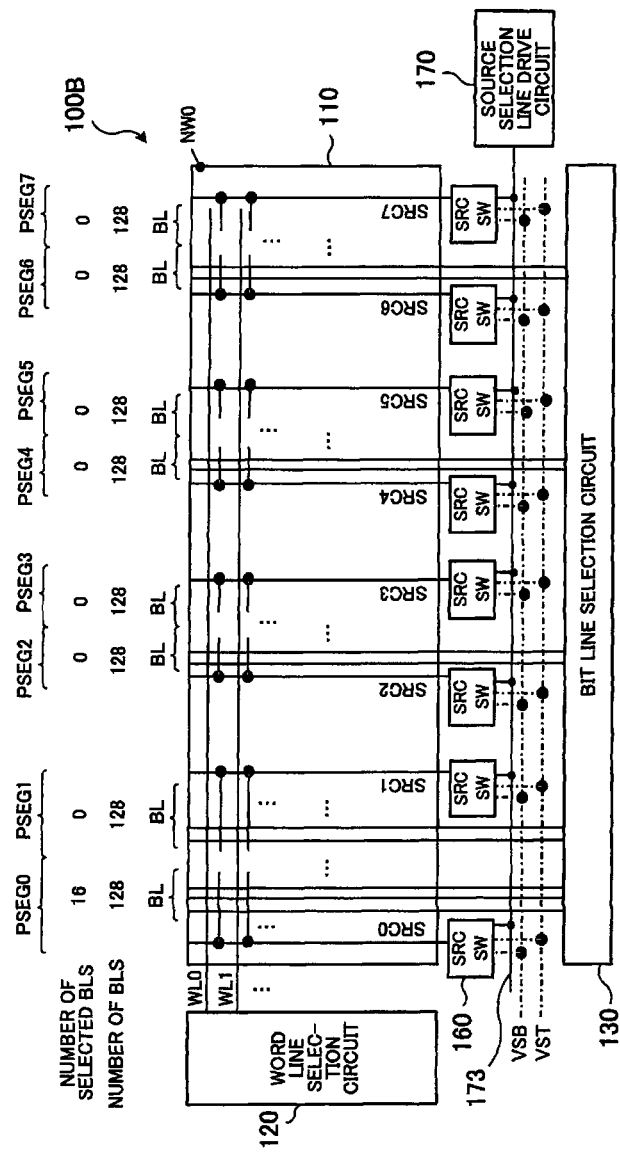
FIG. 23 indicates an example of the structure of a memory block area according to a third embodiment.

FIG. 23 indicates an example of the structure of a memory block area according to a third embodiment.

FIG. 23 illustrates a memory block area 100B divided into eight program segments PSEG0 through PSEG7 by 128 bit lines BL. For the sake of simplicity FIG. 23 does not illustrate memory cells 111 arranged at positions at which word lines WL and bit lines BL intersect.

The structure of a program segment PSEG will be described with the program segment PSEG0 as an example. A gate and a drain of each memory cell 111 in the program segment PSEG0 are connected to a word line WL and a bit line BL respectively. A source of each memory cell 111 in the program segment PSEG0 is connected to a common source line SRC0.

The other program segments PSEG1 through PSEG7 have the same structure that the program segment PSEG0 has. Memory cells 111 included in the program segments PSEG1 through PSEG7 are connected to common source lines SRC1 through SRC7 respectively. The source lines SRC0 through SRC7 in the program segments PSEG0 through PSEG7 are separated from one another. Voltage of the source lines SRC0 through SRC7 is set to voltage VST (1.8 V, for example) or voltage VSB (2.4 V, for example) by source line switches (SRCSW) 160 respectively. Each source line switch 160 is connected to a source selection line drive circuit 170 via a source selection line 173. Furthermore, the word lines WL are shared by the program segments PSEG0 through PSEG7.

A program operation, a read operation, or an erase operation is performed on the memory block area 100B in the same way that is described in the above first embodiment. The source line switches 160A described in the above second embodiment may be used in the memory block area 100B.

With the memory block area 100B according to the third embodiment, the number of bit lines BL in each program segment PSEG is half of the number of bit lines BL in each program segment PSEG in the above memory block area 100A. As a result, time for which memory cells 111 connected to a selected word line WL are influenced at program operation time by gate disturb is half of time for which memory cells 111 connected to a selected word line WL in the above memory block area 100A are influenced at program operation time by gate disturb, and is one-eighth of time for which memory cells 111 connected to a selected word line WL in the above memory block area 100 not divided into program segments PSEG are influenced at program operation time by gate disturb.

Furthermore, a memory cell 111 to be programmed is selected at program operation time from one of the program segments PSEG0 through PSEG7 in the memory block area 100B. For example, if 16 bit lines BL are selected at program operation time, these 16 bit lines BL are selected only from the program segment PSEG0 as indicated in FIG. 23. As a result, voltage of the source lines SRC1 through SRC7 in the remaining program segments PSEG1 through PSEG7 can be made higher than voltage of the source line SRC0 in the program segment PSEG0.

According to the memory block area 100B it is possible to effectively control a change in threshold voltage Vth of memory cells 111 caused by gate disturb, while preventing an increase in leakage current.

The number of bit lines BL (division unit) by which a memory block area is divided into program segments PSEG is not limited to 256 or 128 described above. A memory block area may be divided into program segments PSEG by another number of bit lines BL. A memory block area may be divided into program segments PSEG by 64 or 16 bit lines BL, that is to say, by a smaller number of bit lines BL. Alternatively, the number of bit lines BL may differ among different program segments PSEG.

A fourth embodiment will now be described.

If a memory block area 100 is divided, as in the above embodiments, into a plurality of program segments PSEG, a source line SRC in each program segment PSEG can be formed by the use of a source line SRC parallel to a bit line BL which is originally included in the memory block area 100. However, it may be desirable to prepare an additional source line parallel to a bit line besides such a source line, depending on the number of program segments PSEG after division (case where the memory block area 100 is divided by 16 bit lines BL, for example).

Figure 24:
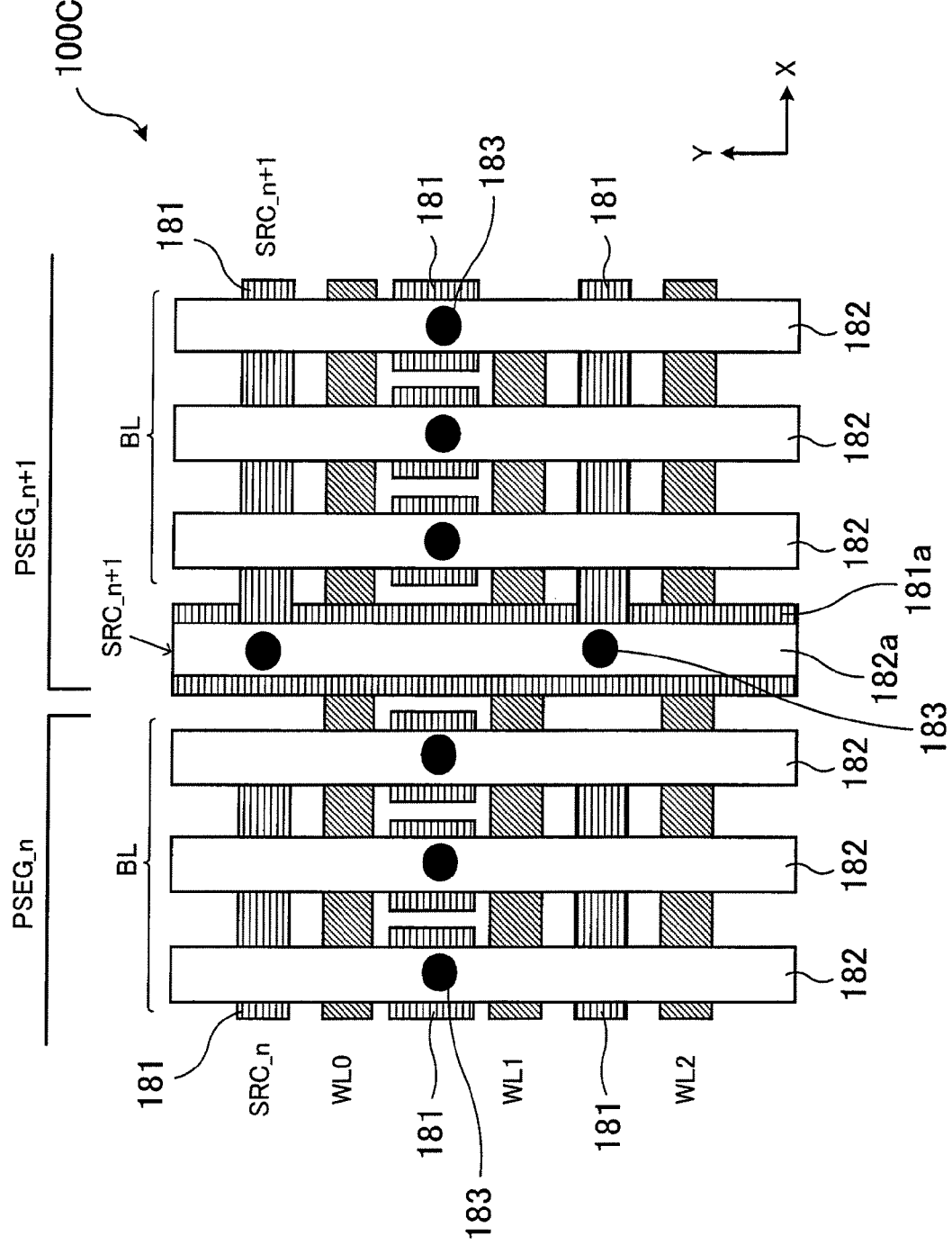
FIG. 24 indicates an example of the structure of a memory block area according to a fourth embodiment.

FIG. 24 indicates an example of the structure of a memory block area according to a fourth embodiment. FIG. 24 indicates an example of the layout of a part of word lines WL, bit lines BL, and source lines SRC in a memory block area.

In a memory block area 100C illustrated in FIG. 24, word lines WL0 through WL2 connected to gates of memory cells 111 extend in a first direction X. Metal wirings 181 connected to drains and sources of memory cells 111 are arranged on both sides of the word lines WL0 and WL1. The metal wirings 181 connected to sources of memory cells 111 are a source line SRC_n in a program segment PSEG_n and a source line SRC_n+1 in a program segment PSEG_n+1. The metal wiring 181 connected to the drains of the memory cells 111 is connected via contacts 183 to metal wirings 182 which are arranged so as to extend in a second direction Y. The metal wirings 182 connected to the drains of the memory cells 111 are bit lines BL.

The source line SRC_n in the program segment PSEG_n and the source line SRC_n+1 in the program segment PSEG_n+1 are separated from each other. The word lines WL0 through WL2 are shared by the program segments PSEG_n and PSEG_n+1.

In the memory block area 100C a metal wiring 181a which extends in the second direction Y is arranged in the same layer where the metal wirings 181 connected to the drains and the sources of the memory cells 111 are arranged. The metal wiring 181 used as the source line SRC_n+1 is connected to the metal wiring 181a. In addition, the metal wiring 181a is connected via contacts 183 to a metal wiring 182a which is arranged in the same layer where the metal wirings 182 used as bit lines BL are arranged and which extends in the second direction Y.

As illustrated in FIG. 24, the metal wiring 181a connected to the sources of the memory cells 111, the contacts 183, and the metal wiring 182a are arranged between adjacent program segments PSEG, depending on the number of program segments PSEG after division. The adoption of this layout makes it possible to accommodate any number of program segments PSEG after division.

A fifth embodiment will now be described.

In a fifth embodiment an address assignment technique will be described. First examples of address assignment in the above memory block areas 100 and 100A are indicated in FIGS. 25 and 26 respectively.

Figure 25:
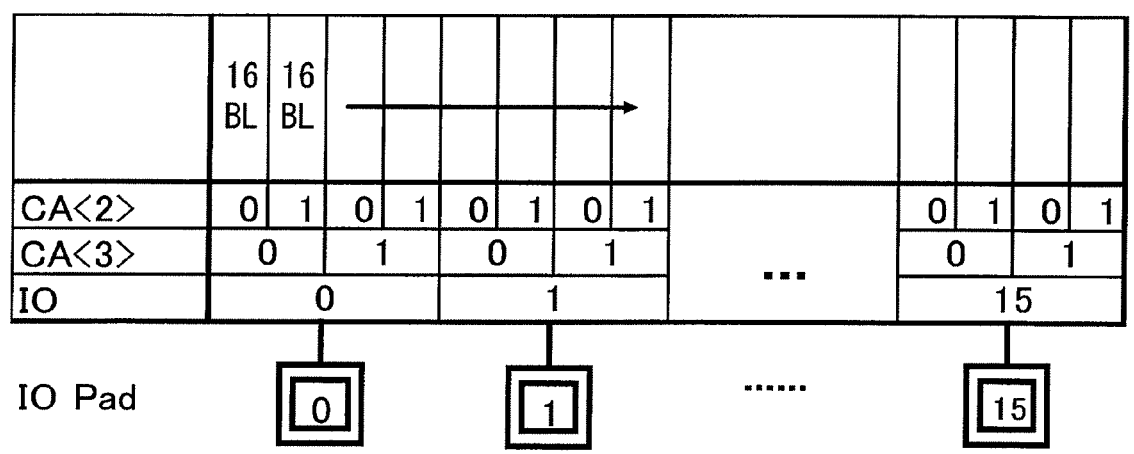
FIG. 25 indicates an example of address assignment (part 1)

In the above memory block area 100, as indicated in FIG. 25, 16 bit lines BL (16BL) are arranged for each combination of column addresses CA <2> and CA <3> and a group made up of a total of 64 bit lines BL is arranged for each IO pad (for each of IO data <0> through <15>). One piece of IO data is selected from each group of 64 bit lines BL on the basis of a column address. 16 bit lines BL are selected on the basis of the column address CA <2:3>.

Figure 26:
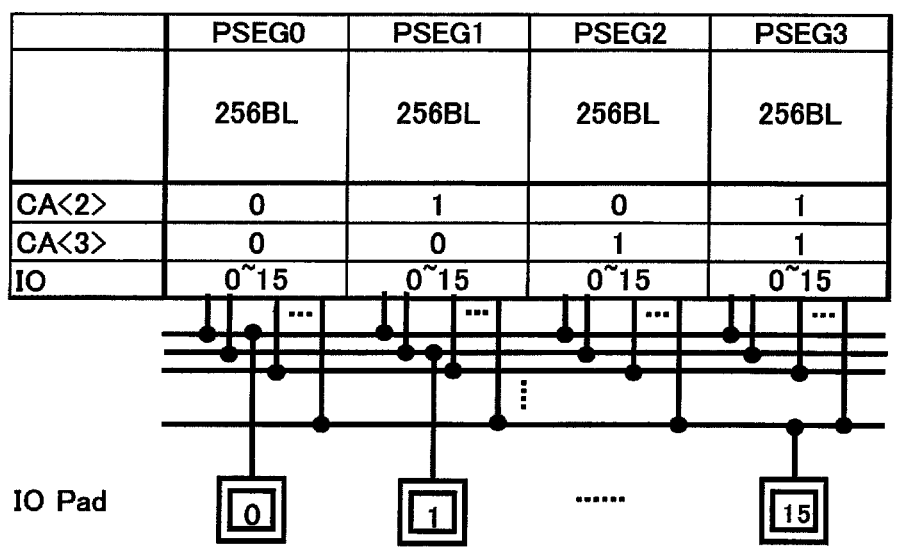
FIG. 26 indicates an example of address assignment (part 2)

Furthermore, in the above memory block area 100A, as indicated in FIG. 26, the program segments PSEG (PSEG0 through PSEG3) are set for every 256 bit lines BL (256BL). One program segment PSEG is selected out of these program segments PSEG on the basis of the column address CA <2:3>. IO data <0> through <15> are selected on the basis of another column address from 256 bit lines BL in the selected program segment PSEG.

It is assumed that selected bit lines BL are assigned to two program segments PSEG in the memory block area 100A.

FIG. 27 indicates an example of selected bit line assignment.

In the example of FIG. 27, lower bits (0 through 7) and upper bits (8 through 15) of a 16-bit signal DI are assigned to program segments PSEG0 and PSEG1 respectively. 8 bit lines are selected from each of the program segments PSEG0 and PSEG1.

In this case, the method of programming the 16-bit signal DI in block and the method of programming the 16-bit signal DI eight bits at a time are compared. If the 16-bit signal DI is programmed in block, the number of times program is performed in a state in which voltage of a source line SRC is low (in a state in which voltage of a source line SRC is set to voltage VST (1.8 V) that is lower than voltage VSB (2.4 V) of a non-selected source line SRC) is 512/16 (=32). On the other hand, if the 16-bit signal DI is programmed eight bits at a time, source lines SRC in the two program segments PSEG0 and PSEG1 are selected and are set to the low voltage VST. The number of times program is performed in a state in which the voltage of the source lines SRC is low is 512/8 (=64). An increase in the number of times program is performed leads to long gate disturb time.

Accordingly, an example to which the following address assignment technique is applied will be described as a fifth embodiment.

Figure 28:
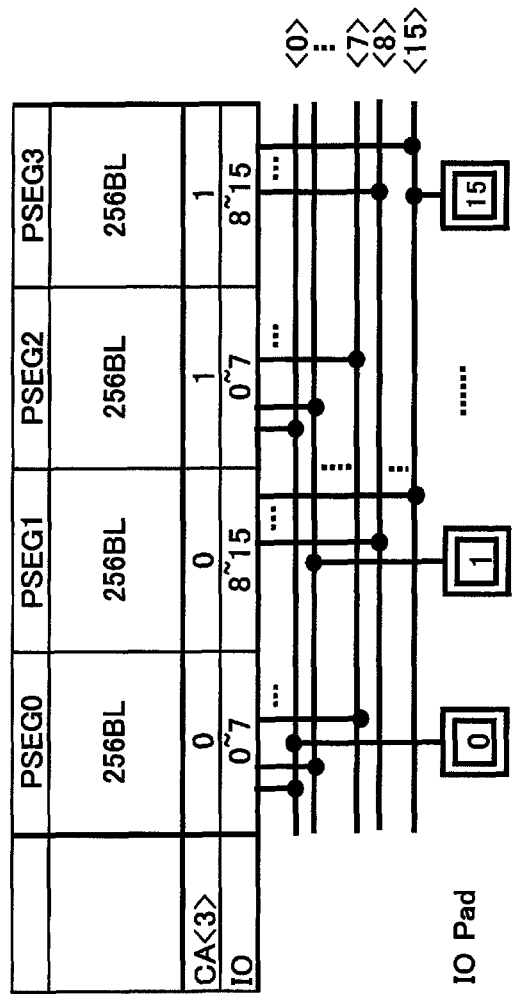
FIG. 28 indicates an example of address assignment according to a fifth embodiment.

FIG. 28 indicates an example of address assignment according to a fifth embodiment.

In the example of FIG. 28, two program segments PSEG (PSEG0 and PSEG1, for example) are selected on the basis of a column address CA <3>. Lower bits (0 through 7) of IO data are selected from one of the two selected program segments PSEG on the basis of another column address. Upper bits (8 through 15) of the IO data are selected from the other of the two selected program segments PSEG on the basis of another column address.

If 8-bit IO data does not include a bit indicative of program, then a corresponding program segment PSEG is not selected and voltage of a source line SRC in the program segment PSEG is high.

Figure 29:
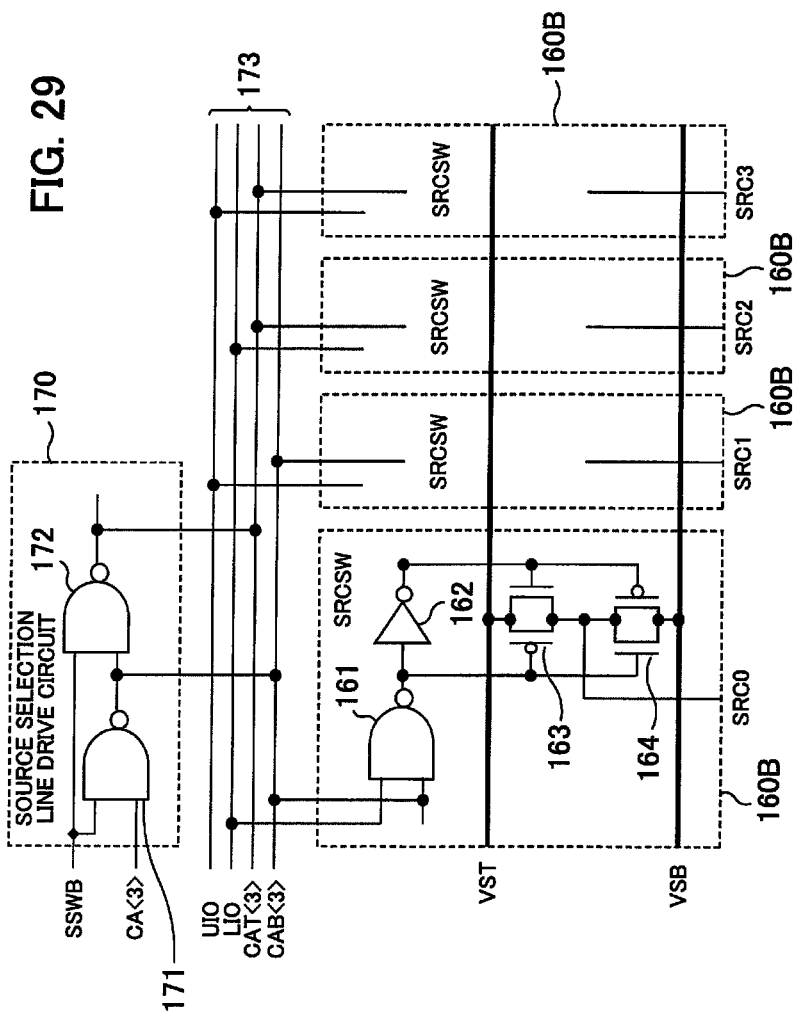
FIG. 29 indicates an example of a source line switch and a source selection line drive circuit in the fifth embodiment.

FIG. 29 indicates an example of a source line switch and a source selection line drive circuit in the fifth embodiment.

The structure of a source line switch SRCSW will be described with a source line switch 160B connected to a source line SRC0 in a program segment PSEG0 as an example. For convenience, FIG. 29 does not illustrate the internal structure of source line switches 160B connected to source lines SRC1 through SRC3 in program segments PSEG1 through PSEG3 respectively.

As indicated in FIG. 29, a signal SSWB and a column address CA <3> for designating a program segment PSEG are inputted at program operation time to a NAND gate 171 of a source selection line drive circuit 170. The signal SSWB and a signal CAB <3> outputted from the NAND gate 171 are inputted to a NAND gate 172. A signal CAT <3> is outputted from the NAND gate 172.

If any of upper bits (8 through 15) of IO data is at the L level at program operation time, a signal UIO is at the H level. If any of lower bits (0 through 7) of the IO data is at the L level at program operation time, a signal LIO is at the H level.

A signal CAB <3> outputted from the source selection line drive circuit 170 and the signal LIO are inputted to a NAND gate 161 of the source line switch 160B connected to the source line SRC0. A signal outputted from the NAND gate 161 and a signal outputted from a NOT gate 162, that is to say, a signal obtained by inverting the signal outputted from the NAND gate 161 are inputted to CMOS transfer gates 163 and 164.

The signal UIO and the signal CAB <3> are inputted to the source line switch 160B connected to the source line SRC1. The signal LIO and the signal CAT <3> are inputted to the source line switch 160B connected to the source line SRC2. The signal UIO and the signal CAT <3> are inputted to the source line switch 160B connected to the source line SRC3. The flow of signal processing performed in these source line switches 160B is the same as that of signal processing performed in the source line switch 160B connected to the above source line SRC0.

Voltage set for a source line SRC is switched at program operation time on the basis of the column address CA <3> for designating a program segment PSEG, the signal UIO, and the signal LIO. Voltage of a source line SRC in a selected program segment PSEG is set to voltage VST (1.8 V) and voltage of a source line SRC in a non-selected program segment PSEG is set to voltage VSB (2.4 V). Operations at program operation time other than the operation of selecting a source line SRC are the same as those indicated in FIG. 18.

If at least one of lower bits (0 through 7) or upper bits (8 through 15) of IO data for a signal DI indicates program, then a source line SRC in a program segment PSEG corresponding to the bit is selected and voltage of the source line SRC is set to the voltage VST by a source line switch 160B. If the lower bits (0 through 7) or the upper bits (8 through 15) of the IO data do not include a bit indicative of program, then a source line SRC in a program segment PSEG corresponding to a bit is not selected and voltage of a source line SRC is set to the higher voltage VSB. As a result, the number of times program is performed in a state in which voltage of a source line SRC is low (in a state in which voltage of a source line SRC is set to the voltage VST that is lower than the voltage VSB of a non-selected source line SRC) is 256/8 (=32). That is to say, gate disturb time is short, compared with a case where source lines SRC in the two program segments PSEG0 and PSEG1 are selected and are set to the low voltage VST.

The technique described in the fifth embodiment can be applied to the memory block areas 100A, 100B, and 100C described in the above second through fourth embodiments, respectively, in the same way.

The above description has been given with a flash memory as an example. However, the above technique regarding program operation can be applied to a semiconductor memory, such as an EPROM or EEPROM, in the same way.

According to the disclosed technique, a semiconductor memory which makes it possible to control at program operation time a change in threshold voltage Vth of a program non-target memory cell caused by gate disturb while preventing an increase in leakage current flowing through a program non-target memory cell is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor memory comprising:
   a plurality of memory blocks which each includes a group of memory cells arranged at positions where a group of word lines and a group of bit lines intersect and connected to a common source line; each memory cell, of the group of memory cells, including a gate directly connected to a word line of the group of word lines, a drain directly connected to a bit line of the group of bit lines and a source directly connected to the common source line; the plurality of memory blocks sharing the group of word lines; each common source line, of the plurality of memory blocks, being separated from one another; and
   a circuit which supplies first voltage at program operation time to a first common source line of a first memory block, of the plurality of memory blocks, including a memory cell to be programmed; and which supplies second voltage different from the first voltage at the program operation time to a second common source line of a second memory block, of the plurality of memory blocks, not including the memory cell to be programmed, wherein:
   each memory cell is a p-channel transistor; and
   at the program operation time the circuit supplies the second voltage to the second common source line of the second memory block, of the plurality of memory blocks, not including the memory cell to be programmed, the second voltage being increased by capacitance coupling between a well in which the second memory block is formed and a source junction of a memory cell in the second memory block.

2. The semiconductor memory according to claim 1, wherein the second voltage is higher than the first voltage.

3. The semiconductor memory according to claim 1, wherein when a program operation is performed once, the memory cell to be programmed is selected from one of the plurality of memory blocks which share the group of word lines.

4. The semiconductor memory according to claim 1, wherein when a program operation is performed once, data including information regarding a plurality of memory cells to be programmed is divided into upper bit data and lower bit data, the upper bit data is associated with one memory block of the plurality of memory blocks, the lower bit data is associated with another memory block of the plurality of memory blocks, and the program operation is performed.

5. The semiconductor memory according to claim 1, wherein:
   the circuit includes a plurality of switch circuits respectively connected to each common source line of the plurality of memory blocks being separated from one another; and
   the plurality of switch circuits each switches voltage supplied to the common source line connected thereto to the first voltage or the second voltage.

6. The semiconductor memory according to claim 1, wherein each memory cell is an electrically programmable nonvolatile memory cell.

7. The semiconductor memory according to claim 1, wherein a number of the bit lines to which the group of memory cells included in each of the plurality of memory blocks are connected is the same.

8. The semiconductor memory according to claim 1, wherein memory blocks which differ in a number of the bit lines to which the group of memory cells are connected are included among the plurality of memory blocks.

\* \* \* \* \*